(12) United States Patent
Mizuta et al.

(10) Patent No.: US 7,907,678 B2
(45) Date of Patent: Mar. 15, 2011

(54) POWER SERIES PREDISTORTER AND CONTROL METHOD THEREOF

(75) Inventors: Shinji Mizuta, Yokohama (JP);
Yasunori Suzuki, Yokohama (JP);
Shoichi Narahashi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 1225 days.

(21) Appl. No.: 11/434,068

(22) Filed: May 16, 2006

(65) Prior Publication Data
US 2006/0262880 A1 Nov. 23, 2006

(30) Foreign Application Priority Data
May 18, 2005 (JP) .................................. 2005-146062

(51) Int. Cl.
*H04L 27/00* (2006.01)
*H04L 25/03* (2006.01)
*H04B 1/04* (2006.01)
*H03F 1/26* (2006.01)
*H03F 1/00* (2006.01)

(52) U.S. Cl. ........ 375/297; 375/295; 375/296; 330/149; 330/151; 455/114.3

(58) Field of Classification Search .................. 375/296, 375/297; 330/52, 149, 151, 152; 455/63.1, 455/91, 126
See application file for complete search history.

(56) References Cited

U.S. PATENT DOCUMENTS

| | | | |
|---|---|---|---|
| 6,275,103 B1 * | 8/2001 | Maniwa | 330/149 |
| 6,359,507 B1 * | 3/2002 | Myer | 330/149 |
| 6,549,067 B1 | 4/2003 | Kenington | |
| 6,577,192 B2 * | 6/2003 | Maniwa et al. | 330/149 |
| 6,717,464 B2 * | 4/2004 | Fudaba et al. | 330/149 |
| 6,737,918 B2 * | 5/2004 | Oishi et al. | 330/149 |
| 7,020,447 B2 * | 3/2006 | Nagatani et al. | 455/114.3 |
| 7,142,615 B2 * | 11/2006 | Hongo et al. | 375/297 |

(Continued)

FOREIGN PATENT DOCUMENTS

EP 1 193 866 A1 4/2002

(Continued)

OTHER PUBLICATIONS

Wolfgang Boesch, et al., "Measurement and Simulation of Memory Effects in Predistortion Linearizers", IEEE Transactions on Microwave Theory and Techniques, vol. 37, No. 12, Dec. 1989, pp. 1885-1890.

(Continued)

*Primary Examiner* — Mohammad H Ghayour
*Assistant Examiner* — Eboni Hughes
(74) *Attorney, Agent, or Firm* — Oblon, Spivak, McClelland, Maier & Neustadt, L.L.P.

(57) ABSTRACT

In a distortion generation path of a power series predistorter, a frequency characteristic compensator that adjusts the frequency characteristic of a distortion component is provided in series with an odd-order distortion generator. The output of a power amplifier is divided to obtain an output signal of the power amplifier, the output signal of the power amplifier is down-converted by a down converter, and a distortion detector detects a distortion component in the down-converted signal of base band. The frequency characteristic of the distortion component is split into windows each having a band width of $\Delta f$ by a distortion component frequency characteristic splitter, and the power of the distortion component in each window is detected. Based on the detected power, the frequency characteristic compensator adjusts a part of the frequency characteristic of the distortion component associated with each window.

9 Claims, 18 Drawing Sheets

U.S. PATENT DOCUMENTS

| | | |
|---|---|---|
| 7,170,342 B2 | 1/2007 | Suzuki et al. |
| 2004/0116083 A1* | 6/2004 | Suzuki et al. ............... 455/126 |
| 2004/0189378 A1* | 9/2004 | Suzuki et al. ............... 330/52 |
| 2005/0101254 A1* | 5/2005 | Sasaki et al. ............... 455/63.1 |
| 2005/0168283 A1* | 8/2005 | Suzuki et al. ............... 330/149 |
| 2005/0189990 A1* | 9/2005 | Mizuta et al. ............... 330/52 |
| 2005/0190857 A1* | 9/2005 | Braithwaite ............... 375/296 |
| 2005/0237113 A1* | 10/2005 | Matsuura et al. ............ 330/149 |
| 2006/0023807 A1* | 2/2006 | Shako et al. ............... 375/296 |
| 2006/0067426 A1* | 3/2006 | Maltsev et al. ............. 375/297 |

FOREIGN PATENT DOCUMENTS

| | | |
|---|---|---|
| EP | 1 429 453 A1 | 6/2004 |
| JP | 2002-57533 | 2/2002 |
| JP | 2003-92518 | 3/2003 |
| JP | 2005-65211 | 3/2005 |

OTHER PUBLICATIONS

U.S. Appl. No. 11/444,494, filed Jun. 1, 2006, Suzuki et al.
U.S. Appl. No. 11/446,381, filed Jun. 5, 2006, Suzuki et al.

* cited by examiner

POWER SERIES PREDISTORTER AND CONTROL METHOD THEREOF

BACKGROUND OF THE INVENTION

1. Field of the Invention

The present invention relates to a power series predistorter that compensates for distortion produced by a power amplifier used in a mobile phone terminal and a base station, for example, and a control method thereof.

2. Description of the Related Art

Microwave power amplifiers used in base stations or terminals of mobile telecommunication systems are required to achieve high efficiency in order to reduce the power consumption or size thereof. In general, the power added efficiency of a power amplifier becomes higher as the output power thereof becomes closer to the saturation output power, and thus, it is desirable that the power amplifier operates in that region. However, if the power amplifier operates with output power close to the saturation output power, the distortion component produced by the power amplifier increases. Since the power amplifiers used in the base stations and terminals have to achieve a predetermined adjacent channel leakage power ratio outside the signal band as defined radio systems regulations, the power amplifiers are operated with sufficient output backoff. Therefore, the power added efficiency of the amplifiers becomes poor. Thus, in order to operate the power amplifier with output power close to the saturation output power to achieve higher power added efficiency, the distortion component produced by the power amplifier has to be suppressed.

Various nonlinear distortion compensation methods for suppressing the distortion component have been developed. One of such nonlinear distortion compensation methods is a predistortion method. The predistortion method is to previously add a predistorted distortion component that cancels the distortion component produced by the power amplifier to the input signal. The distortion component produced by the power amplifier can be cancelled by configuring the predistorted distortion component to be previously added (referred to as predistortion, hereinafter) to be equal in amplitude and opposite in phase to the distortion component produced by the power amplifier.

FIG. 18 shows a configuration of a typical power amplifier incorporating a conventional power series predistorter. In this example, a power series predistorter 100 comprises a divider 1, a linear transmission path 2, a distortion generation path 3, a combiner 4, a distortion detector 9 and a vector adjustment controller 10. The distortion generation path 3 includes a distortion generator 31 and a vector adjuster 32. A transmission signals x(t) of base band is input to the divider 1, which distributes the transmission signal x(t) of base band to the linear transmission path 2, which is constituted by a delay unit 21, and the distortion generation path 3. In the distortion generation path 3, the distortion generator 31 generates a third-order predistortion component expressed as $|x(t)|^2 x(t)$ (referred to as $D^3$, hereinafter), for example, in accordance with the input transmission signal x(t) of base band, and the vector adjuster 32 adjusts the amplitude and phase of the predistortion component and inputs the adjusted predistortion component to one terminal of the combiner 4. To the other terminal of the combiner 4, the transmission signal x(t) of base band delayed by the delay unit 21 is input. The transmission signal of base band and the predistortion component are combined together by the combiner 4, the combination signal is passed to a frequency converter 5 as an output of the predistorter 100 and converted into a transmission signal of radio frequency, and the transmission signal of radio frequency is amplified by a power amplifier 6.

The output signal of the power amplifier 6 is transmitted to an antenna element (not shown) via a divider 7, and the divider 7 passes part of the output signal to a frequency converter 8. The frequency converter 8 converts the output signal from the divider 7 into a down-converted signal of base band and passes the down-converted signal of base band to the distortion detector 9. The distortion detector 9 detects the distortion component of the down-converted signal that is produced by the power amplifier 6 and passes the detected distortion component to the vector adjustment controller 10. The vector adjustment controller 10 controls the vector adjuster 32 in the distortion generation path 3 to adjust the amplitude and phase of the third-order distortion component in such a manner that the third-order component in the output signal of the power amplifier 6 detected by the distortion detector 9 is minimized. Controlling the amplitude and phase in the vector adjuster 32 in this way can cancel the distortion component produced by the power amplifier. It is known that the conventional predistorter can compensate the symmetric third-order distortion component which is not frequency dependency.

However, if the power amplifier 6 operates around the saturation output power, the conventional predistorter described above may not be able to achieve higher distortion compensation. This is because a memory effect occurs in the nonlinear characteristics of the power amplifier, as described in W. Bosch and G. Gatti, "Measurement and simulation of memory effects in predistortion linearizer," IEEE Trans. Microwave Theory Tech., vol. 37, pp 1885-1890, December 1989 (referred to as non-patent literature 1, hereinafter). The memory effect is produced by passing a distortion component through a band-pass filter, and causes to impart a frequency characteristic to the distortion component produced by the power amplifier 6. This results in uneven frequency characteristics on the higher and lower sides of a signal band 400 after the predistortion compensation (indicated by a dashed line) unlike the frequency characteristics before the predistortion compensation (indicated by a solid line) as shown in FIG. 19, for example. The conventional predistorter cannot compensate for such frequency dependency.

A technique to cope with the distortion compensation with the frequency dependency is disclosed in Japanese Patent Application Laid-Open No. 2002-57533 (referred to as patent literature 1, hereinafter). FIG. 20 is a diagram illustrating the prior art disclosed in the patent literature 1. The prior art differs from the power series predistorter described above with reference to FIG. 18 in the configuration of the distortion generation path 3. The distortion component generated by the distortion generator 31 is split into a low frequency band distortion component and a high frequency band distortion component via a low pass filter 351 and a high pass filter 352. The amplitude and phase of the distortion of the low frequency band distortion component are adjusted by a vector adjustment circuit 321, and the amplitude and phase of the distortion component of the high frequency band distortion component are adjusted by a vector adjustment circuit 322. In this way, the distortion component generated by the distortion generator 31 is split into two frequency bands by two filters, and the frequency characteristics of the distortion components of the respective frequency bands are adjusted, thereby suppressing the frequency dependent distortion compensation.

According to the compensation method of reducing the frequency dependency of the distortion, plurality of filters are used to split the frequency dependency of the distortion component. However, since frequency characteristics of the filter generally cannot have infinite rise and fall at the ends of the pass band thereof, an overlap or drop occurs at the boundary between the pass bands of the filters, so that a discontinuity occurs in the amplitude frequency characteristic and the phase frequency characteristic. Therefore, there is a problem that, in the case where a modulated signal having a continuous spectrum is input, a continuous amplitude frequency characteristic and phase frequency characteristic cannot be imparted to the predistortion component because of the variations of the frequency characteristics of the filters.

SUMMARY OF THE INVENTION

The present invention has been devised in view of such circumstances, and an object of the present invention is to provide a power series predistorter that prevents any discontinuity from occurring in the distortion compensation characteristic when a modulated signal having a continuous spectrum is input thereto.

According to the present invention, a power series predistorter that generates a predistortion component for compensating for an distortion component produced by a power amplifier comprises:

a linear transmission path for linearly transmitting an input signal;

a distortion generation path including an odd-order distortion generator for generating an odd-order distortion component for the input signal;

a frequency characteristic compensator inserted in series in the distortion generation path, for adjusting the frequency characteristic of the odd-order distortion component;

a combiner for combining an output of the linear transmission path and an output of the distortion generation path to form an output of the predistorter;

a distortion detector for detecting a distortion component in an output signal of the power amplifier;

a distortion component frequency characteristic splitter for splitting the frequency band of the distortion component into windows each having a predetermined band width and for detecting the power of the distortion component in each window; and a frequency characteristic controller for controlling adjustment of a corresponding part of the frequency characteristic by the frequency characteristic compensator based on the power of the distortion component detected in each window.

According to the present invention, coefficients of a frequency characteristic compensator are controlled by the frequency characteristic controller based on the distortion component detected in each window having a band width of $\Delta f$. Therefore, any discontinuity does not occur in the frequency characteristic formed by the frequency characteristic compensator. Thus, the power series predistorter can compensate the frequency dependent distortion components even when a modulated signal having a continuous spectrum is input thereto. This is because the frequency characteristic compensator is formed as a single filter.

DETAILED DESCRIPTION OF THE PREFERRED EMBODIMENTS

Figure 1:
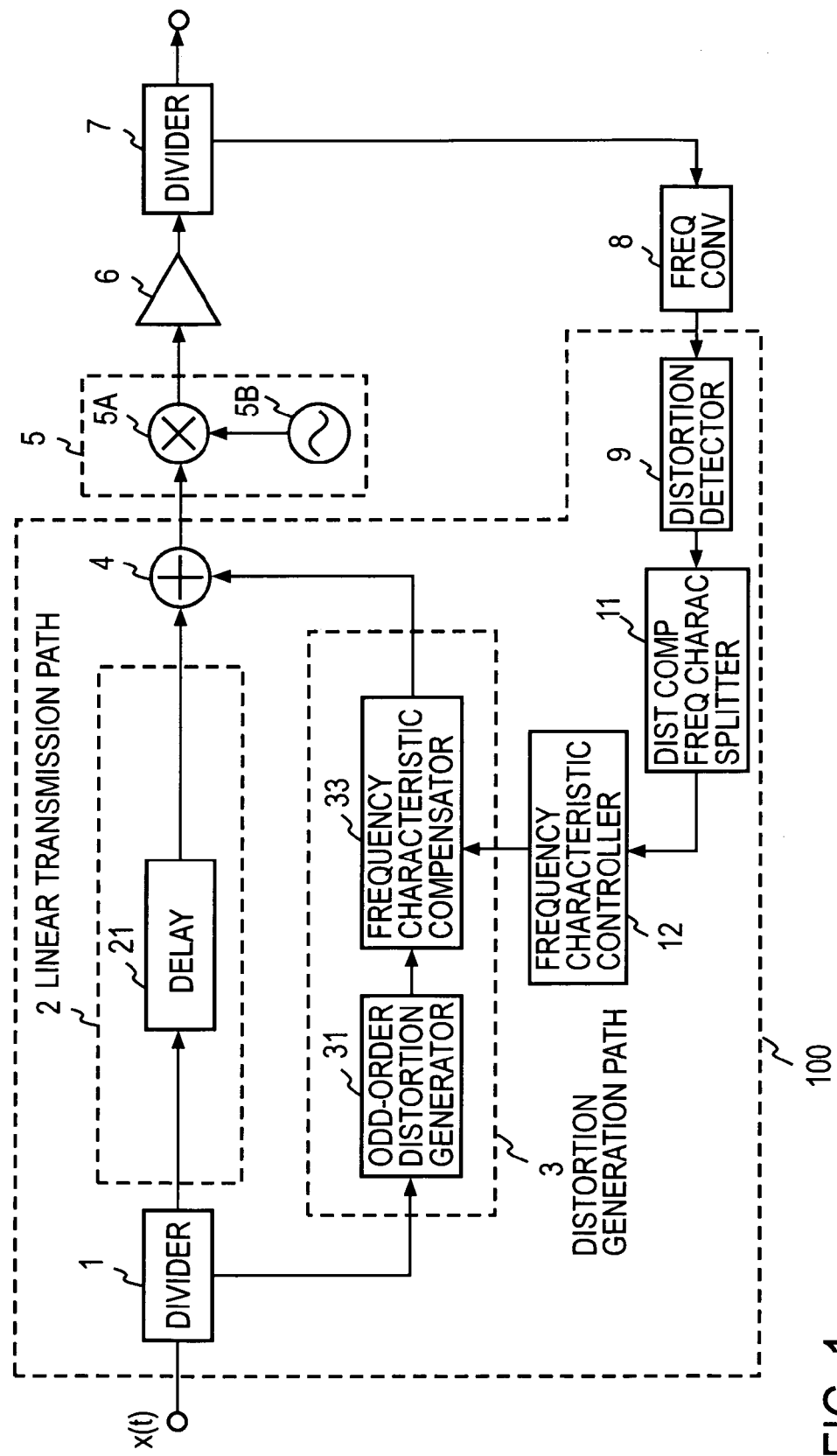
FIG. 1 is a block diagram showing a basic configuration of the present invention.

In the following, embodiments of the present invention will be described with reference to the drawings. In the drawings, corresponding parts are denoted by the same reference numerals, and redundancy of description will be omitted.

[Basic Configuration]

FIG. 1 shows a basic configuration of a power series predistorter according to the present invention. A predistorter 100 of this basic configuration comprises a divider 1, a linear transmission path 2, a distortion generation path 3, a combiner 4, a distortion detector 9, a distortion component frequency characteristic splitter 11 and a frequency characteristic controller 12. The distortion generation path 3 includes an odd-order distortion generator 31 and a frequency characteristic compensator 33. The divider 1 distributes an input transmission signal x(t) of base band to the linear transmission path 2 and the distortion generation path 3. The linear transmission path 2 is constituted by a delay unit 21 and transmits the transmission signal x(t) to the combiner 4 after delaying the signal by a length of time equal to the delay time of the distortion generation path 3.

The odd-order distortion generator 31 generates an odd-order distortion component, a third-order distortion component $D^3$ for example, for the input transmission signal x(t) of base band by calculation or by reading from a ROM in which calculation results are previously stored as data. The frequency characteristic compensator 33 adjusts the frequency characteristic of the input odd-order distortion for each split window of a width Δf. The output third-order distortion component $D^3$ of the distortion generation path 3 is passed to the combiner 4 and combined with the transmission signal x(t) of base band from the linear transmission path 2, and the combined signal x(t)+$D^3$ is output from the predistorter 100 to a frequency converter 5.

The signal x(t)+$D^3$, which is a sum of the transmission signal x(t) of base band and the predistortion component generated by the distortion generation path 3, is converted into a upconverted signal of radio frequency by the frequency converter 5, which is composed of a mixer 5A and a local oscillator 5B. The upconverted signal is amplified by a power amplifier 6 and then passed to a second divider 7. The power amplifier 6 is operated at a point close to the saturation output power thereof to achieve higher power added efficiency. The distortion component produced in the output signal of the power amplifier 6 can be reduced by adjusting the predistortion component ($D^3$, in this description) generated by the distortion generation path 3 to be equal in amplitude and opposite in phase to the distortion component produced by the power amplifier 6.

In order to adjust the predistortion component, part of the output signal of the power amplifier 6 is fed back via the divider 7. The output signal fed back via the divider 7 is down-converted into a down-converted signal of base band by a frequency converter 8. The resulting down-converted signal is input to the distortion detector 9.

The distortion detector 9 extracts a distortion component in the down-converted signal and passes the distortion component to the distortion component frequency characteristic splitter 11. The distortion component frequency characteristic splitter 11 splits the frequency characteristic of the detected distortion component into windows of frequency bands each having a band width of Δf and measures the power for each split frequency band. The measurement value is passed to the frequency characteristic controller 12.

Based on the measurement value for each split frequency band received from the distortion component frequency characteristic splitter 11, the frequency characteristic controller 12 makes the frequency characteristic compensator 33 controls the odd-order distortion component for the associated split frequency band of the odd-order distortion component.

Since the proposed predistorter is configured as described above, and the frequency characteristic compensator 33 is controlled to reduce the power in each split frequency band of the distortion component produced by the power amplifier 6 to be equal to or less than a certain target value, the distortion component produced by the power amplifier 6 can be compensated.

The present invention is characterized in that the distortion component in the fed-back down-converted signal of base band is split into windows each having a band width of Δf and detected on a window basis, and the predistortion component can be adjusted within the relevant frequency band based on the detection result.

In particular, since the frequency characteristic of the predistortion component is controlled by the single frequency characteristic compensator 33, distortion compensation can be adequately achieved without any discontinuity occurring in the filter compensating the frequency dependency of the distortion components produced by the power amplifier. That is because the frequency characteristic compensator 33 acts as a single filter.

Various distortion detection methods can be contemplated that detect a distortion component in a fed-back down-converted signal of base band by splitting the distortion component into windows having a band width of Δf.

First Embodiment

Figure 2:
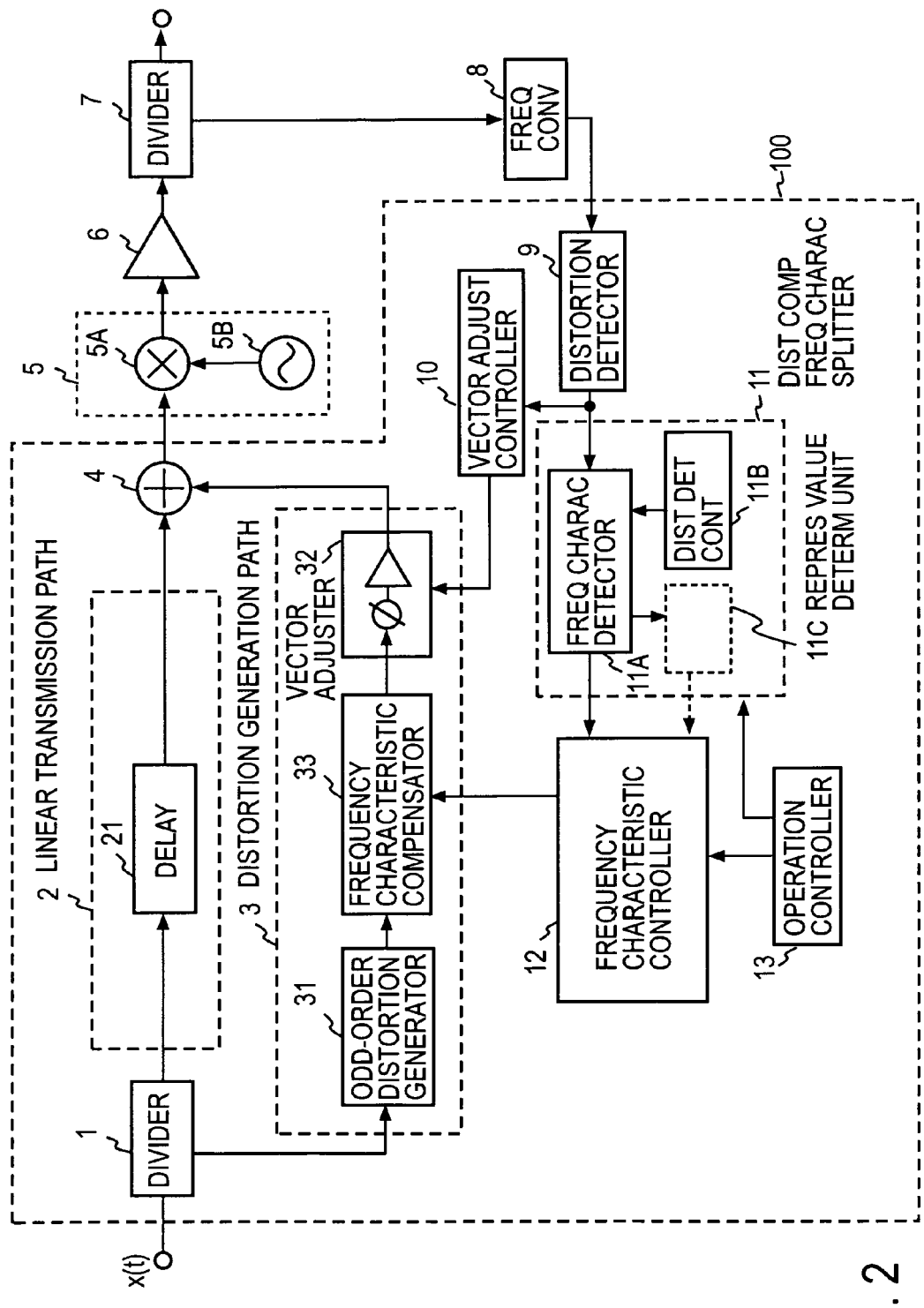
FIG. 2 is a diagram showing the first embodiment of the present invention.
Figure 18:
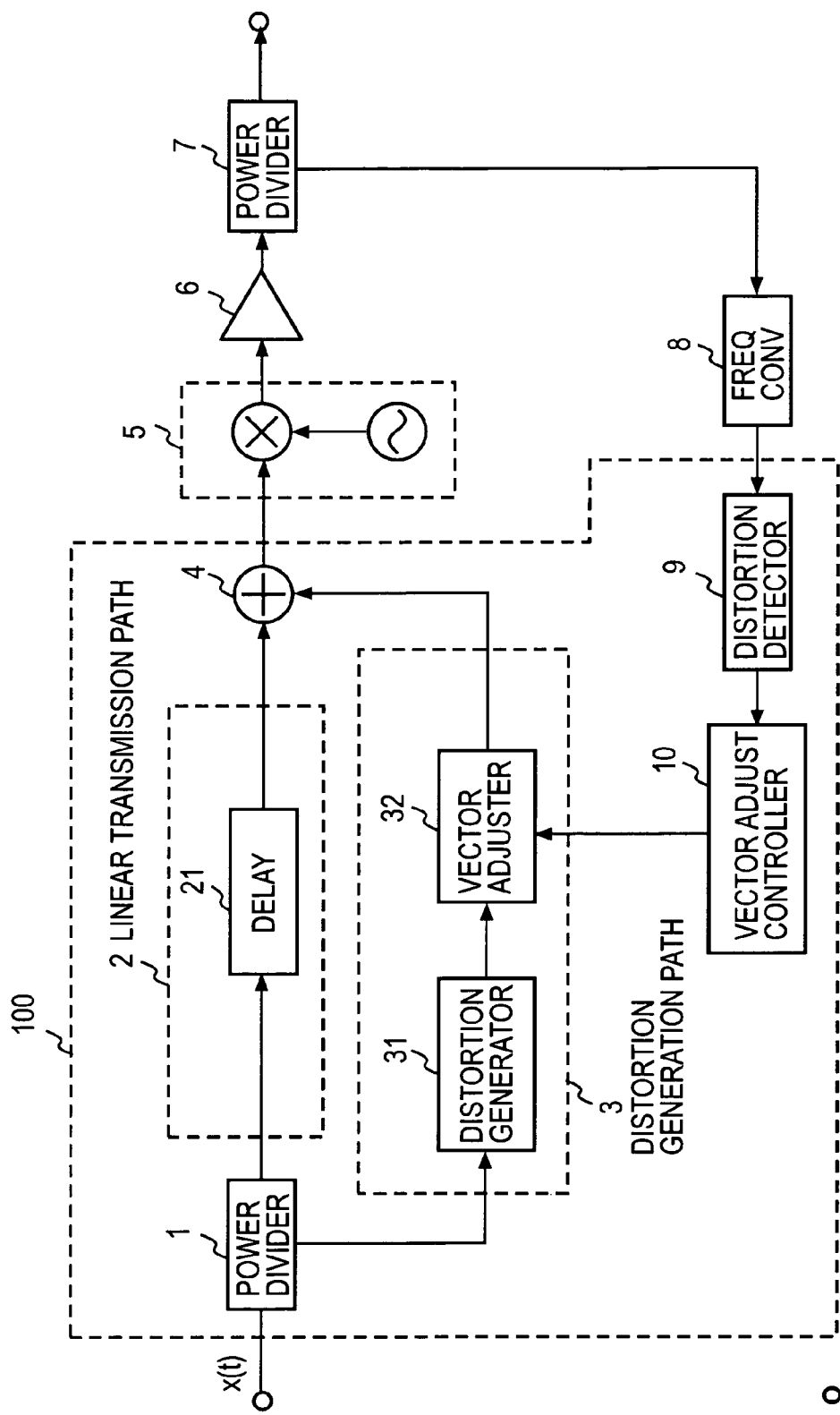
FIG. 18 is a diagram showing a typical configuration of a power amplification device incorporating a conventional power series predistorter.
Figure 19:
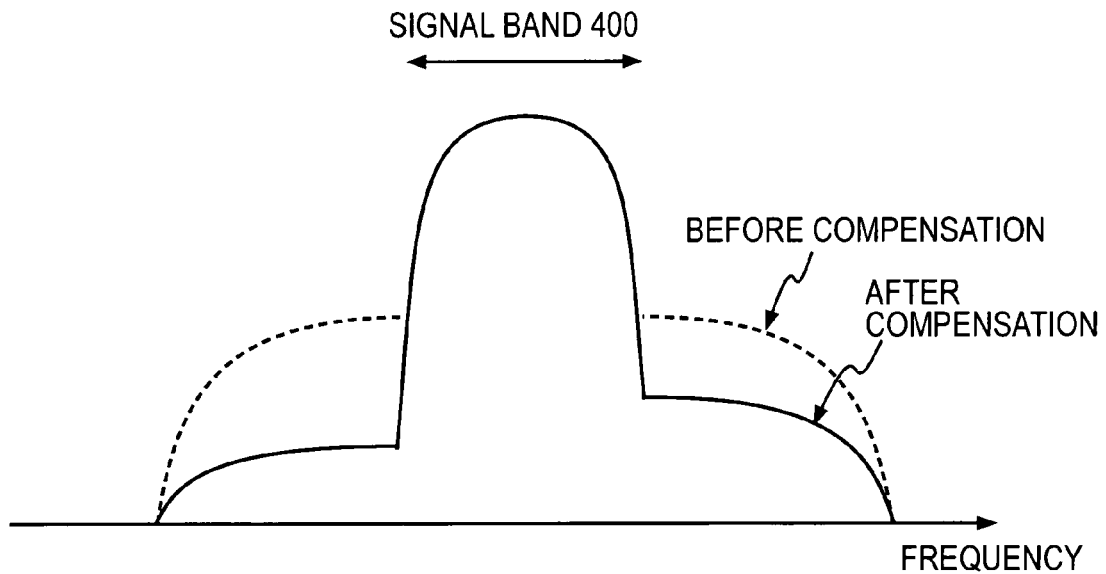
FIG. 19 shows a frequency characteristic of a signal having been subjected to conventional predistortion compensation.
Figure 20:
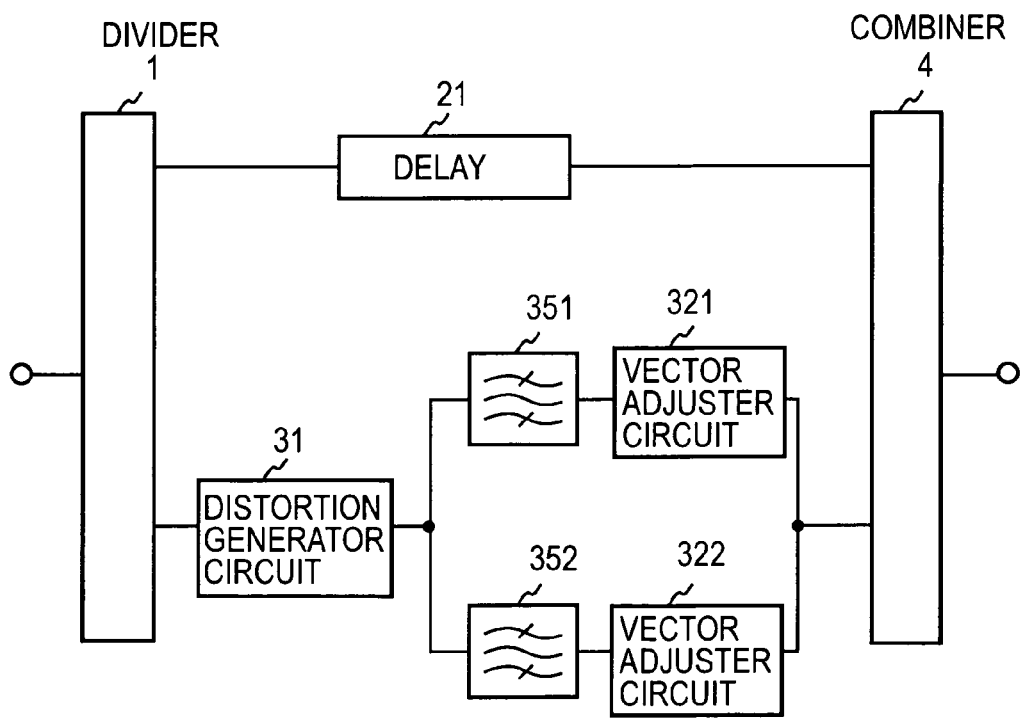
FIG. 20 is a diagram illustrating the predistorter disclosed in the patent literature 1.

FIG. 2 shows a power series predistorter according to a first embodiment of the present invention. In a predistorter 100 according to this embodiment, a distortion component frequency characteristic splitter 11 comprises a frequency characteristic detector 11A and a distortion detection controller 11B. The distortion component detected by the distortion detector 9 is split into band widths of Δf by the frequency characteristic detector 11A in the distortion component frequency characteristic splitter 11, and the power is measured for each split band (window). The distortion detection controller 11B controls the way of splitting. In addition, a distortion generation path 3 includes a vector adjuster 32, which is composed of a phase shifter and a multiplier as in the prior-art example shown in FIG. 18, and controls the amplitude and phase of the distortion component having a compensated frequency characteristic based on a vector adjustment from a vector adjustment controller 10.

Now, operations of components according to this embodiment will be described with reference to FIG. 2 and other drawings. According to this embodiment of the present invention shown in FIG. 2, the frequency characteristic controller 12 and the distortion component frequency characteristic splitter 11 are controlled by an operation controller 13, which is constituted by a digital signal processor (abbreviated as DSP, hereinafter), for example. For example, immediately after transmission equipment incorporating the predistorter is powered on, or immediately after ratio channel switching is done, the predistorter is adjusted (that is, the vector adjuster 32 and the frequency characteristic compensator 33 are adjusted). Since the distortion compensation is more effective by the vector adjuster 32 than by the frequency characteristic compensator 33, the phase and amplitude adjustments by the vector adjuster 32 are first carried out. If the distortion component detected by the distortion detector 9 becomes equal to or less than a predetermined level as a result of the adjustments, the adjustment of the predistorter may be ended without carrying out the coefficients adjustment by the frequency characteristic compensator 33. If the distortion component detected by the distortion detector 9 does not become equal to or less than the predetermined level after the phase and amplitude adjustments by the vector adjuster 32, the coefficients adjustment by the frequency characteristic compensator 33 is carried out. In this manner, it is possible to quickly finish distortion compensation at the time of power-on, radio-channel switching or the like.

Figure 3:
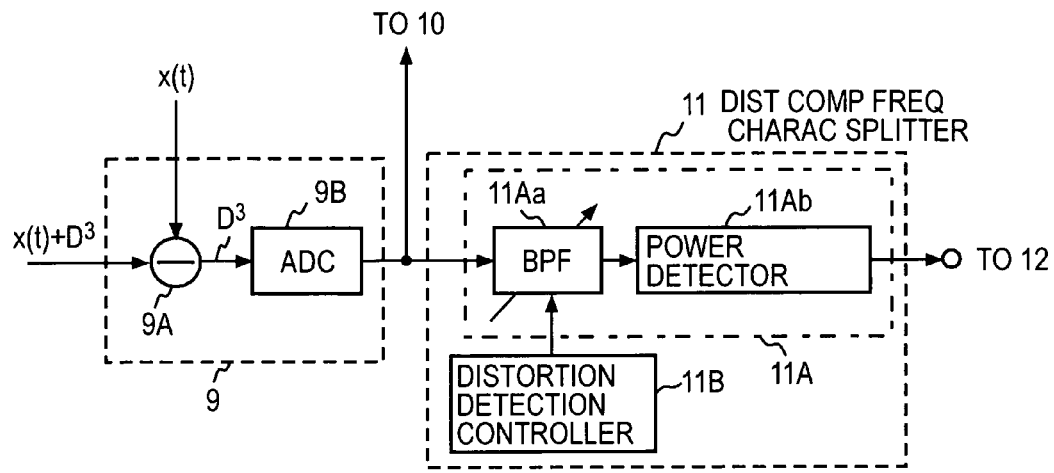
FIG. 3 is a block diagram showing exemplary configurations of a distortion detector and a distortion component frequency characteristic splitter.

FIG. 3 shows an exemplary configuration of the distortion detector 9 and the distortion component frequency characteristic splitter 11 shown in FIG. 2. The distortion detector 9 is composed of a subtracter 9A and an analog-to-digital converter (referred to as AD converter, hereinafter) 9B. The distortion component frequency characteristic splitter 11 is composed of a frequency characteristic detector 11A and a distortion detection controller 11B. The frequency characteristic detector 11A is composed of a band pass filter (abbreviated as BPF, hereinafter) 11Aa and a power detector 11Ab. In FIG. 3, the BPF 11Aa is constituted by a digital filter. The digital filter may be of the finite impulse response (FIR) type or the infinite impulse response (IIR) type.

Figure 5:
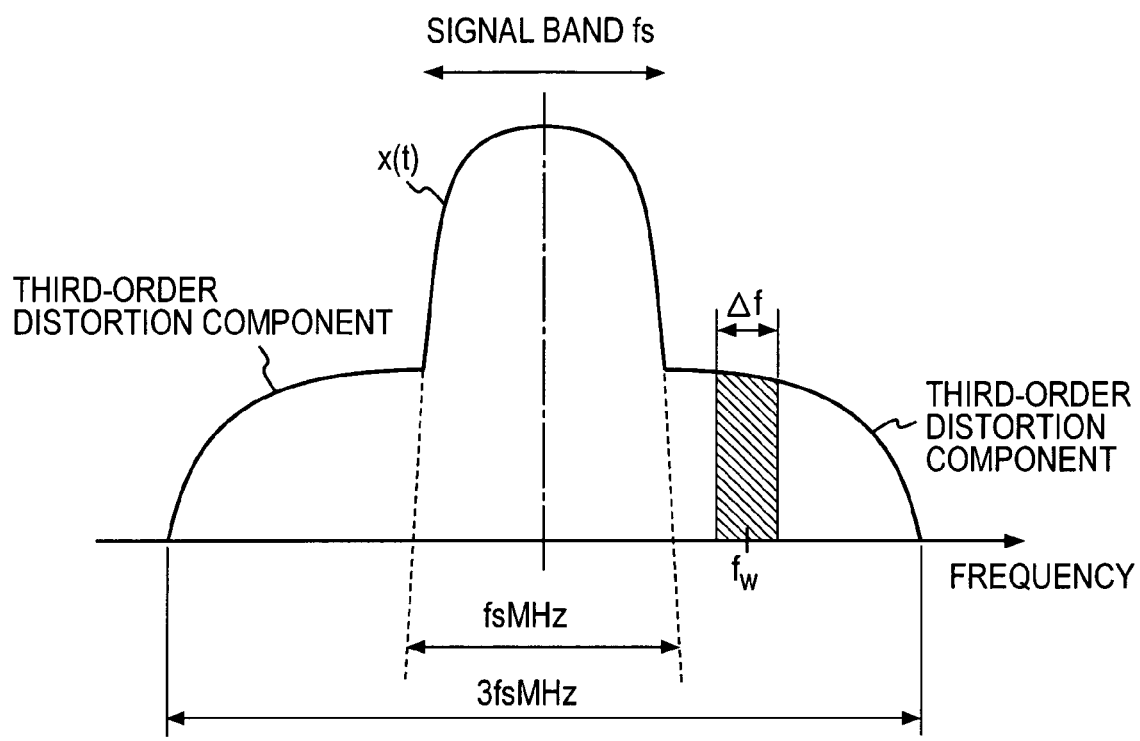
FIG. 5 is a schematic diagram showing a third-order distortion produced by a power amplifier 6.

Assuming that the band width of the transmission signal x(t) is fs [MHz] as shown in FIG. 5, the band width of the third-order distortion component produced by the power amplifier 6 is 3 fs [MHz]. For example, in the case of a wideband code division multiple access (W-CDMA) system, fs≈4.68 MHz. In the following, the third-order distortion component produced by the power amplifier 6 will be referred to as $D^3$. The subtracter 9A subtracts the transmission signal x(t) of base band from the signal having the band width of 3 fs [MHz] to obtain the distortion component $D^3$, and the distortion component $D^3$ is converted into a digital signal by the AD converter 9B. The distortion component output from the AD converter 9B is supplied to the vector adjustment controller 10. The distortion component is also split by the digital BPF 11Aa having a band width of $\Delta f=1$ MHz, for example, in the distortion component frequency characteristic splitter 11.

The filter coefficients of the digital BPF 11Aa can be successively changed by the distortion detection controller 11B. This means that the pass-band width and center frequency of the BPF 11Aa can be changed successively. For example, the frequency characteristic of the distortion component is detected by successively shifting the center frequency $f_w$ of the window having a fixed pass-band width of $\Delta f$ by $\Delta f$ within the band width 3 fs of the third-order distortion component. While the transmission signal x(t) of base band is subtracted by the subtracter 9A at the input side of the AD converter 9B in FIG. 3, the transmission signal x(t) of base band may be subtracted at the output side of the AD converter 9B. Furthermore, in the case where the distortion component within the transmission signal band is sufficiently small compared to the power of the transmission signal, the distortion compensation may be performed only on the windows outside the transmission signal band without performing distortion compensation within the transmission signal band.

Power of the output signal of the digital filter BPF 11Aa is detected by the power detector 11Ab, which is composed of a square circuit and an integrator (both not shown), for example. Each time the center frequency $f_w$ of the digital filter BPF 11Aa is changed, that is, for each $\Delta f$ window, the value of the power of the distortion component $D^3$ is determined by the power detector 11Ab. The power value for each window determined by the power detector 11Ab may be stored in a RAM, such as a DSP, (not shown) and supplied to the frequency characteristic controller 12. Since there is one BPF 11Aa, and the center frequency $f_w$ of the filter is successively changed by the distortion detection controller 11B, there is no need of providing a plurality of filters in the arrangement of FIG. 3.

Figure 4:
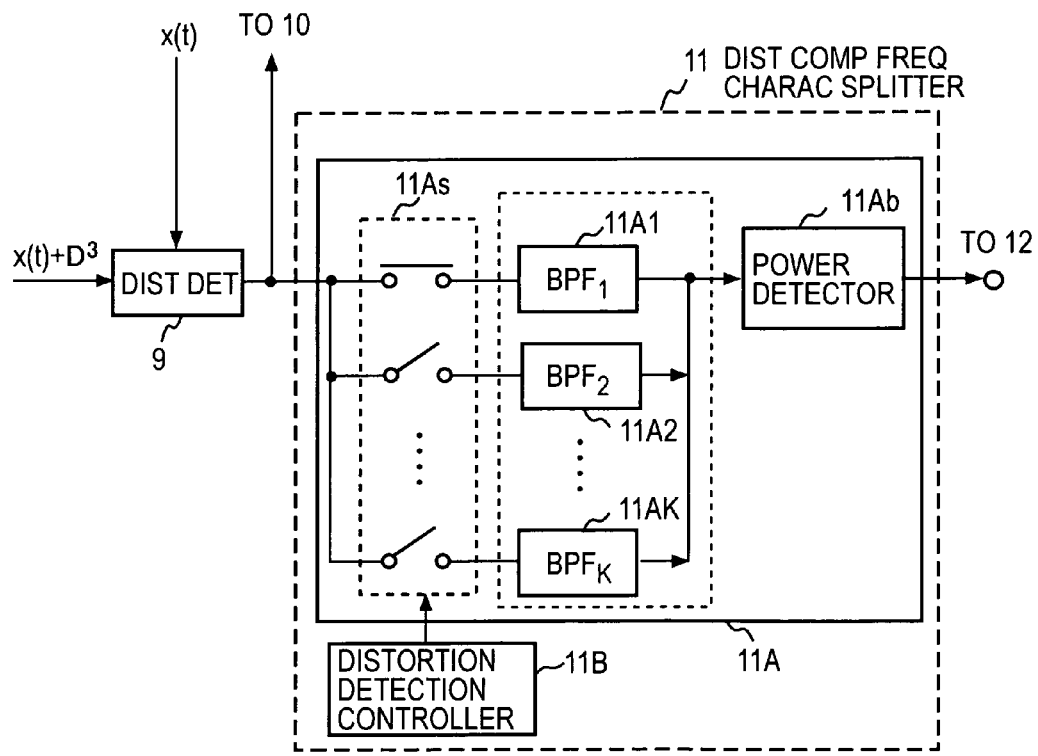
FIG. 4 is a block diagram showing another configuration of the distortion component frequency characteristic splitter.

FIG. 4 shows another example of the distortion component frequency characteristic splitter 11. In this example, instead of the digital BPF 11Aa shown in FIG. 3, a plurality of digital BPFs 11A1 to 11AK and switches 11As located at the input side of the BPFs for selecting any one of the BPFs are provided. The digital signal converted from the distortion component $D^3$ by the AD converter 9B is selectively input to one of the plurality of digital BPFs 11A1 to 11AK via the switches 11As. The switches 11As are controlled by the distortion detection controller 11B. Each of the digital BPFs 11A1 to 11AK is configured to have a band width $\Delta f=1$ MHz of a single filter and a center frequency $f_w$ so that the entire band width of the distortion component $D^3$ is covered by the entire digital BPFs. The outputs of the digital BPFs 11A1 to 11AK are connected to the power detector 11Ab, and the digital BPFs 11A1 to 11AK are switched, successively, by the switches 11As. The distortion component obtained by switching among the digital BPFs 11A1 to 11AK is converted into a power value, and the power value is supplied to the frequency characteristic controller 12.

Alternatively, in FIG. 4, the switches 11As may be omitted, and the detected distortion component may be supplied to all the BPFs 11A1 to 11AK to extract the distortion components by the BPFs in parallel. In this case, although not shown, as many power detectors 11Ab as the number of digital filters, that is, K power detectors 11Ab are provided, and the power values for the distortion components extracted by all the digital filters are detected simultaneously, so that the operation time of the distortion detector can be reduced.

In either of the configurations shown in FIGS. 3 and 4, if the power value determined by the power detector 11Ab is temporarily stored in a RAM or the like (not shown) and evaluation is made on the distortion compensation operation for each power value, the operation of the distortion compensation can be achieved efficiently.

For example, if the distortion compensation is carried out only for a window in which the power of the detected distortion component is high and is omitted for a window in which the power of the detected distortion component is low, the duration of the distortion compensation can be reduced. This can be achieved by the frequency characteristic controller 12 evaluating the power of the distortion component in each window and selecting a window for which distortion compensation is to be performed or determining the direction of sweep of the center frequency $f_w$.

Figure 6:
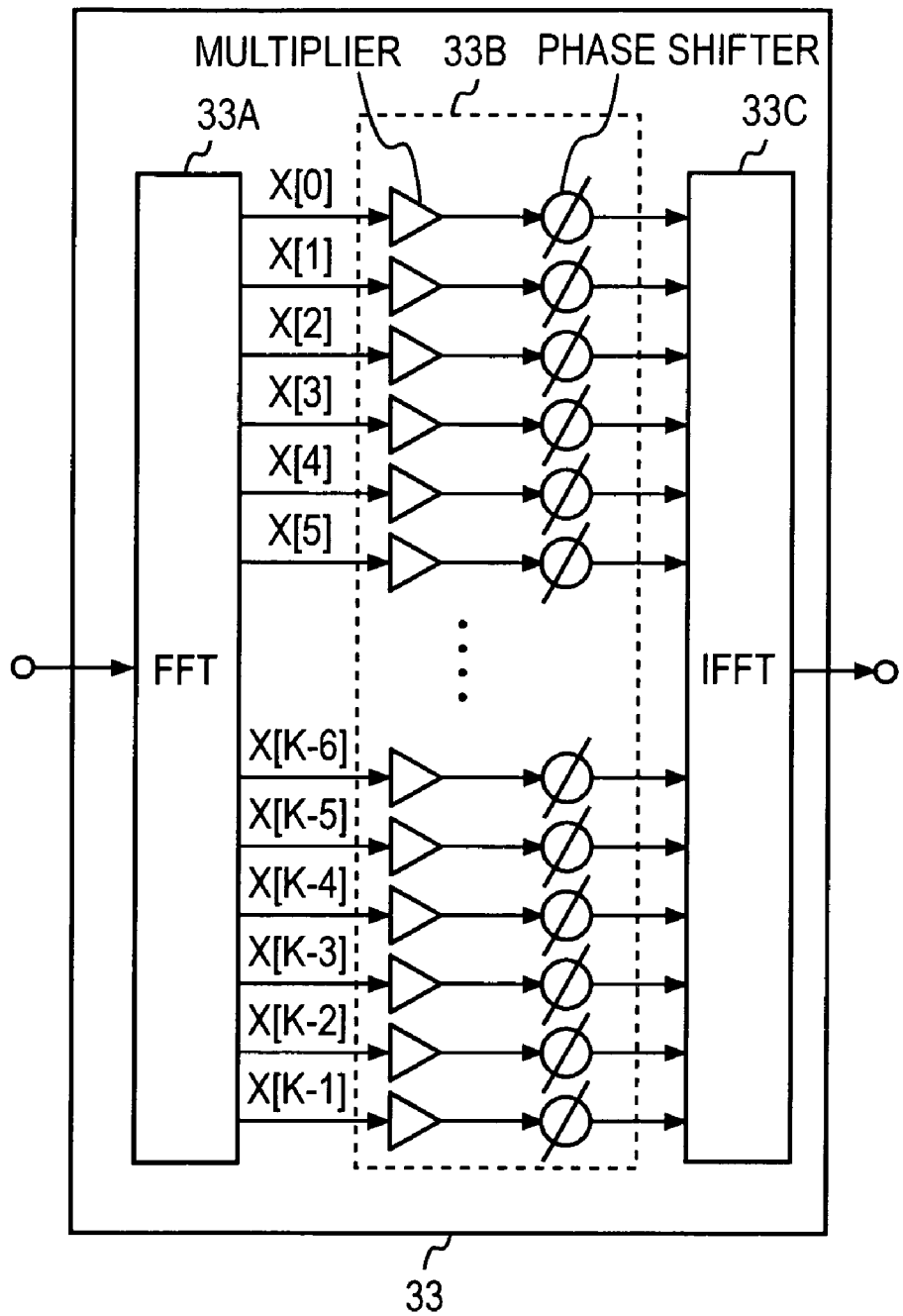
FIG. 6 shows a frequency characteristic compensator that is composed of an FFT and an IFFT.

Next, the frequency characteristic compensator 33 in the distortion generation path 3 shown in FIG. 2 will be described. As shown in FIG. 6, the frequency characteristic compensator 33 is composed of a fast Fourier transformer (abbreviated as FFT, hereinafter) 33A, a coefficients adjuster 33B for adjusting amplitude and phase, and an inverse fast Fourier transformer (abbreviated as IFFT, hereinafter) 33C connected in series to each other, for example.

For example, in the case where the band width $\Delta f$ of each window provided by the distortion component frequency characteristic splitter 11 is 1 MHz, the frequency characteristic compensator 33 has to compensate for the frequency-dependent distortion components according to the window of the band width $\Delta f$. In the case where the frequency characteristic compensator 33 is an FFT as described above, the frequency intervals between sample points in the spectrum obtained by FFT has to be 1 MHz or less. In the following, a case where the window width $\Delta f$ is equal to the FFT frequency interval will be described.

In FIG. 2, the distortion component outputted by the add-order distortion generator 31 samples in a frequency domain and the sampling intervals by $\Delta f$. For example if the number of FFT points is K and $\Delta f$ is 1 MHz, the bandwidth of the sampled signal is K MHz.

As a result, spectra of the amplitude "a" and phase "θ" of the distortion component can be provided at intervals of 1 MHz as expressed by the following formula (1).

$$a_k \exp(j\theta_k) \qquad (1)$$

In this formula, $a_k$ represents an amplitude spectrum, $\theta_k$ represents a phase spectrum, and a subscript k is 0, 1, . . . , K−1. In the example described above, K spectrum sample points are provided at intervals of 1 MHz. In actual, the more the sample points in each window, the more precise the frequency characteristic can be adjusted, so that it is desirable to reduce the sampling frequency interval to provide a greater K.

Figure 7:
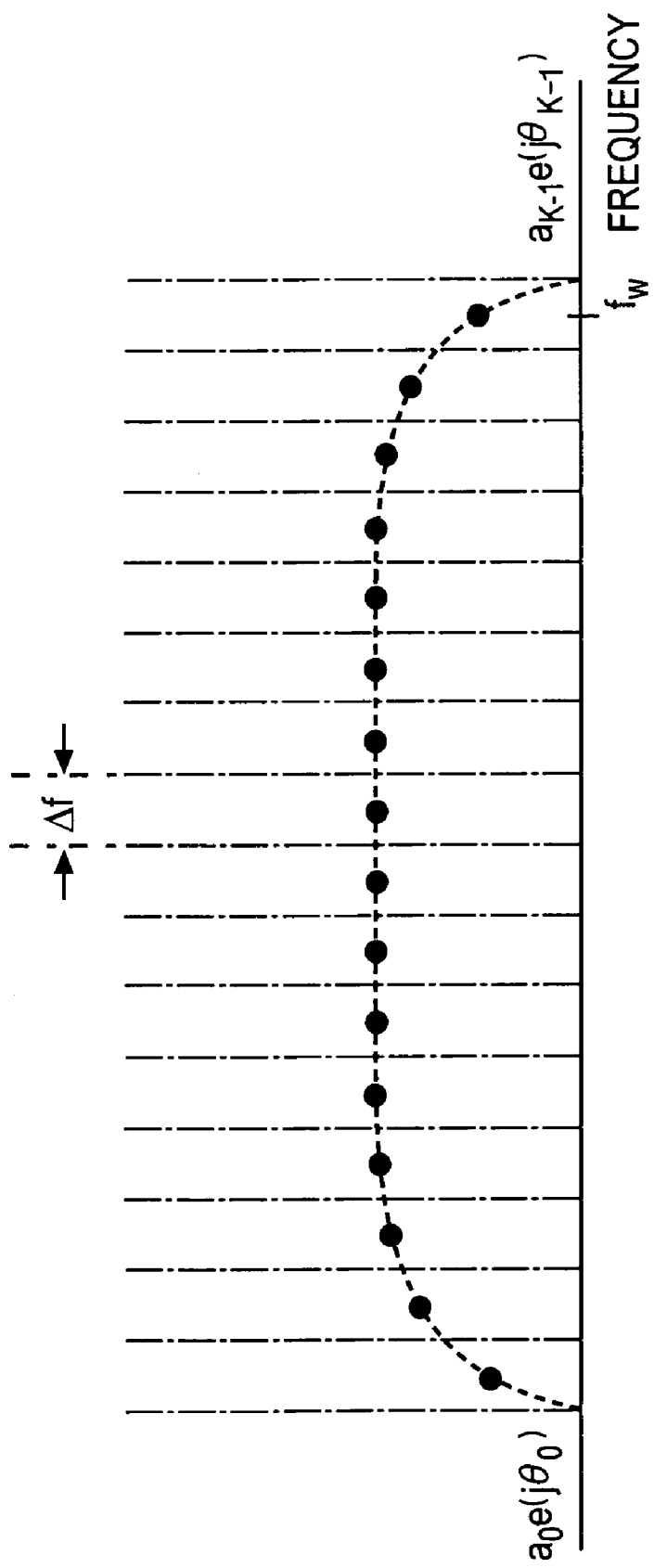
FIG. 7 is a schematic diagram showing a spectrum obtained by the frequency characteristic compensator shown in FIG. 6.

FIG. 7 is a schematic diagram showing this spectrum. For convenience of explanation, FIG. 7 shows only the amplitude spectrum. In FIG. 7, the horizontal axis indicates the frequency, the dot line indicates the characteristic of the predistortion component $D^3$ described above, and the vertical alternate long and short dash lines each indicate the boundary between windows having a band width of $\Delta f$ that are produced by the distortion component frequency characteristic splitter 11. There are 16 windows. The dot in each window each having the band width of $\Delta f$ represents a spectrum sample point $X[0]=a_0 \exp(j\theta_0)$ to $X[15]=a_{15} \exp(j\theta_{15})$ after FFT.

Figure 8:
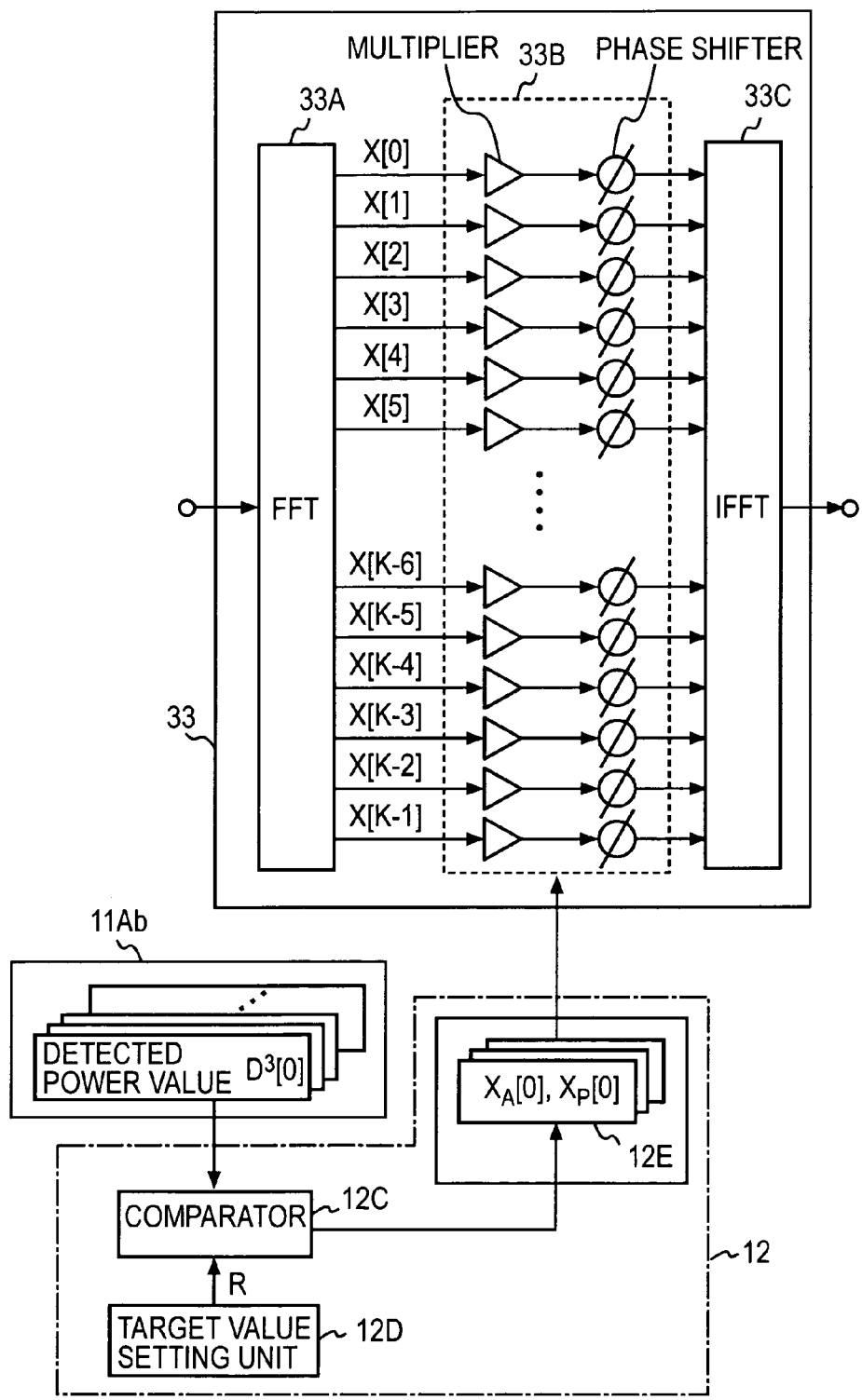
FIG. 8 is a diagram for illustrating a method of controlling an odd-order frequency characteristic compensator using the power value of a distortion detected by a distortion detector.

Now, a method of controlling phase and amplitude of the spectrum sample points $a_0 \exp(j\theta_0)$ to $a_{15} \exp(j\theta_{15})$ based on a control signal from the frequency characteristic controller 12 will be described with reference to FIG. 8. The frequency characteristic controller 12 has a comparator 12C, a target value setting unit 12D and a coefficients controller 12E. The power detector 11Ab in the distortion component frequency characteristic splitter 11 shown in FIGS. 3 and 4 detects the power value for each window, and thus, there are obtained as many power values as the number of $\Delta f$ windows. In the example described here, there are 16 power values $D^3[0]$ to $D^3[15]$, which are stored in a RAM or the like (not shown), for example.

The power value of the detected distortion component for each window determined in the distortion component frequency characteristic splitter 11 is input to the comparator 12C in the frequency characteristic controller 12. The target value setting unit 12D retains a value R that is predetermined as a target value for distortion component outside the band at the output of the power amplifier 6. The comparator 12C compares the power value of the distortion component detected for each window against the target value R and supplies the comparison results to the coefficients controller 12E. If a determined power value is not equal to or less than the target value R, the coefficients controller 12E adjusts the amplitude and the phase by the multiplier and the phase shifter, respectively, associated with the relevant window in the coefficients adjuster 33B. That is, the amplitude adjustment $X_A$ and the phase adjustment $X_P$ previously supplied to the multiplier and the phase shifter are incremented by predetermined step widths $\Delta x$ and $\Delta p$ to provide a new amplitude adjustment $X_A$ and a new phase adjustment $X_P$, respectively. The new amplitude adjustment $X_A$ and the new phase adjustment $X_P$ are supplied to the multiplier and the phase shifter connected in series and associated with the window in the coefficients adjuster 33B, respectively. Then, the relevant spectrum component of the odd-order distortion component is multiplied by the amplitude adjustment $X_A$ and the phase adjustment $X_P$ to compensate for the frequency characteristic of the distortion component. The adjustment of a k-th spectrum sample is expressed by the following formulas.

$$\text{amplitude adjustment}=a_k X_{Ak} \quad (2)$$

$$\text{phase adjustment}=\exp\{j(\theta_k+X_{Pk})\} \quad (3)$$

In these formulas, $k=0, 1, \ldots, K-1$.

The odd-order distortion component compensated for the frequency characteristic by the coefficients adjuster 33B is converted back to a time-domain distortion component by the IFFT 33C. The distortion component $D^3$ in the time domain is adjusted in amplitude and phase by the vector adjuster 32 under the control of the vector adjustment controller 10 in such a manner that the power of the distortion component detected by the distortion detector 9 is minimized, as in the prior-art example shown in FIG. 17.

In this way, it is determined whether the absolute value of the distortion component determined for each window having a band width of $\Delta f$ by the distortion component frequency characteristic splitter 11 is equal to or less than the target value R, the amplitude and phase adjustments are incremented by $\Delta x$ and $\Delta p$, respectively, for any windows for which the distortion is not equal to or less than the target value R, and the spectrum samples associated with the windows from the FFT 33C are repeatedly adjusted. In this way, the distortion compensation is achieved by the frequency characteristic compensator 33 compensating for the amplitude and phase of the frequency characteristic of the predistortion component.

The amplitude and phase adjustment carried out by the vector adjuster 32 is the same as that carried out by the vector adjuster in the conventional predistorter, and therefore, will not be described in detail. The vector adjuster 32 may be disposed between the odd-order distortion generator 31 and the frequency characteristic compensator 33 so that the frequency dependency of the distortion component is compensated for after the vector adjustment of the odd-order distortion component is carried out.

An embodiment in which the distortion detector 9 is constituted by a digital filter has been described. The FFT and IFFT may be a discrete Fourier transformer (DFT) and an inverse discrete Fourier transformer (IDFT), respectively.

Second Embodiment

Figure 9:
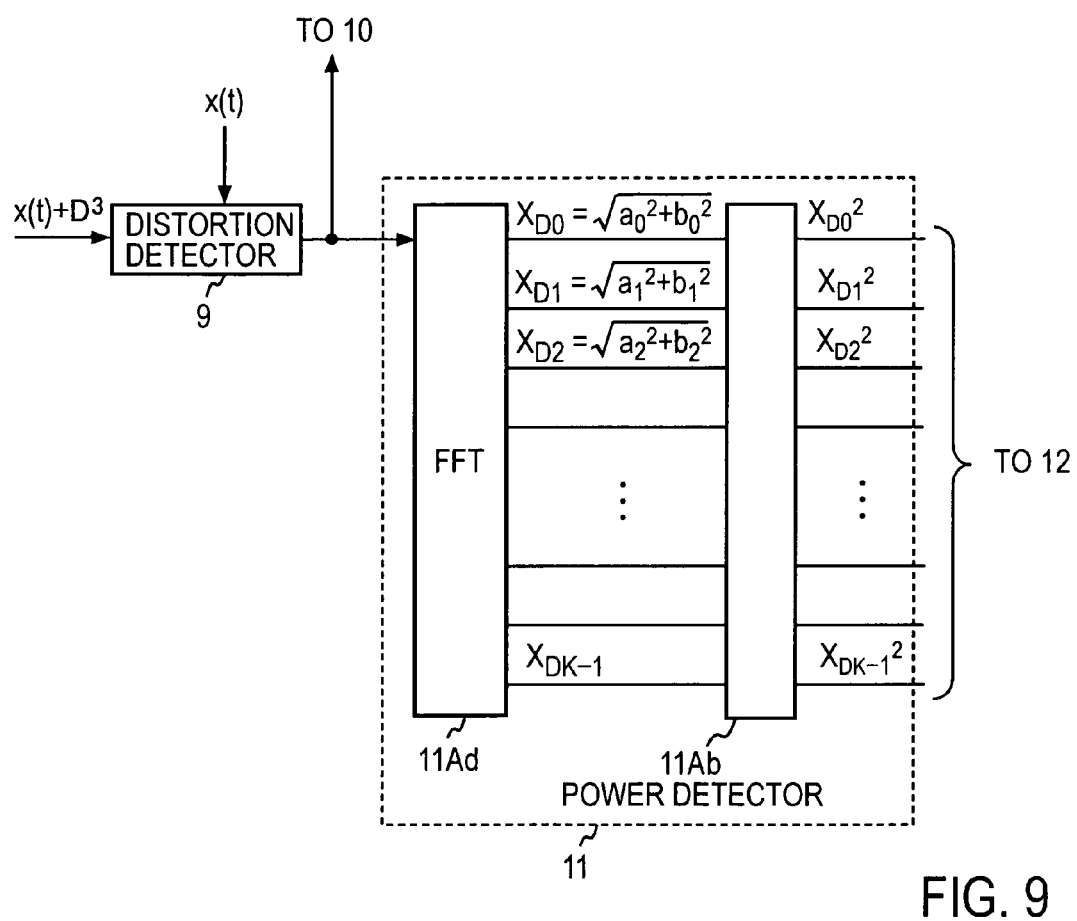
FIG. 9 shows a frequency characteristic detector that is composed of an FFT and an IFFT.

FIG. 9 shows another configuration of the distortion component frequency characteristic splitter 11 shown in FIG. 2. In this example, the detected distortion component is split into spectra having a frequency width of $\Delta f$ by an FFT, rather than into windows each having a band width of $\Delta f$ by the digital filter. The third-order distortion component $D^3$ detected by the distortion detector 9 is input to an FFT processing unit 11Ad as a digital signal. The FFT processing unit 11Ad performs FFT processing to split the digital data into K pieces as with the FFT 33A in the frequency characteristic compensator 33 shown in FIG. 6, for example. As a result, the time required for the FFT analysis is $(1/f_{ADC}) \times K$ [s]. The "$f_{ADC}$" represents the frequency band width of the third-order distortion component at the output of the power amplifier 6. Therefore, spectrum samples are obtained at intervals of $f_{ADC}/K$ [Hz], which is an inverse of an analysis time length for FFT. That is, as a result of the FFT, amplitude spectra $X_{Dk}=(a_k^2+b_k^2)^{1/2}$ and phase spectra $\theta_{Dk}=\tan^{-1}(b_k/a_k)$ are obtained at a frequency of $f_{ADC}/K$ [Hz]. The "$a_k$" and "$b_k$" represent a real part and an imaginary part of the spectrum, respectively. Here, $k=0, 1, \ldots, K-1$. The spectra are supplied to the power detector 11B and converted into a power spectrum $X_{Dk}^2=a_k^2+b_k^2$ for each sample point.

Based on the power spectrum, the frequency characteristic controller 12 makes the frequency characteristic compensator 33 compensate for the frequency characteristic of the distortion component $D^3$ in the same manner as described above. The operation is essentially the same as in the case shown in FIG. 6, and therefore, the third-order distortion component $D^3$ can be compensated for the frequency characteristic for spectra at intervals of $f_{ADC}/K$ [Hz]. In some cases, very precise compensation of the frequency-dependent distortion component may not be required. In such a case, the frequency interval of the distortion compensation by the frequency characteristic compensator 33 can be expanded.

Third Embodiment

In the first and second embodiments described above, it is supposed that the band width $\Delta f$ of each split window provided by the distortion component frequency characteristic splitter 11 is equal to the frequency interval of spectrum sampling by the frequency characteristic compensator 33, and the phase and amplitude of the spectrum sample associated with each window are adjusted. To the contrary, according to a third embodiment, as shown in FIGS. 10A and 10B, K spectrum samples in the frequency characteristic compensator 33 are divided into a plurality of groups each containing a plurality of samples, and all the spectrum samples in each group are adjusted in amplitude and phase using the same adjustments $X_A$ and $X_P$.

Figure 10B:
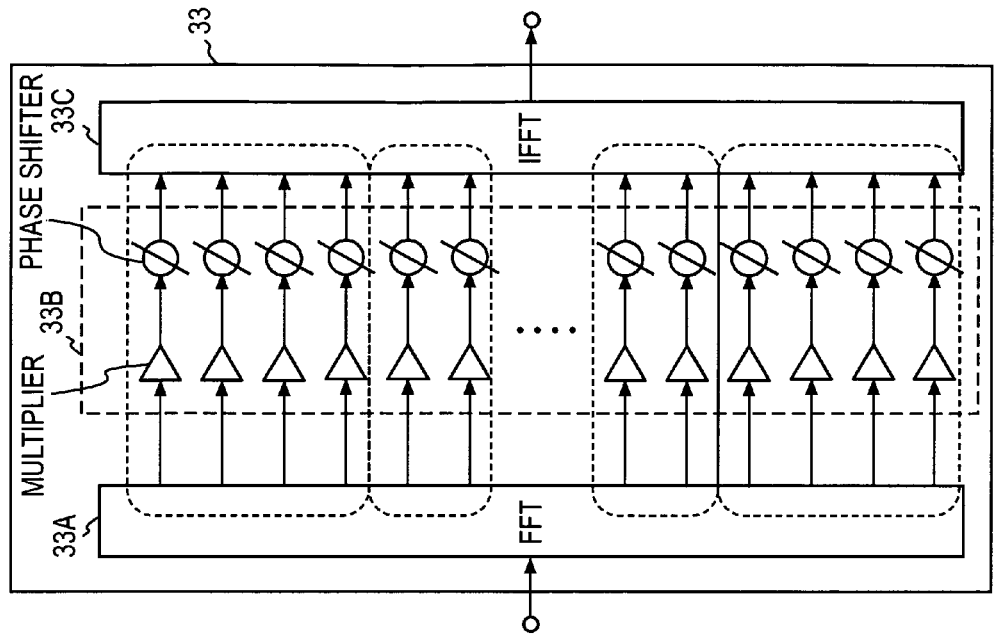
FIG. 10B shows another example of the frequency characteristic compensator that processes a plurality of spectrum samples concurrently.
Figure 10A:
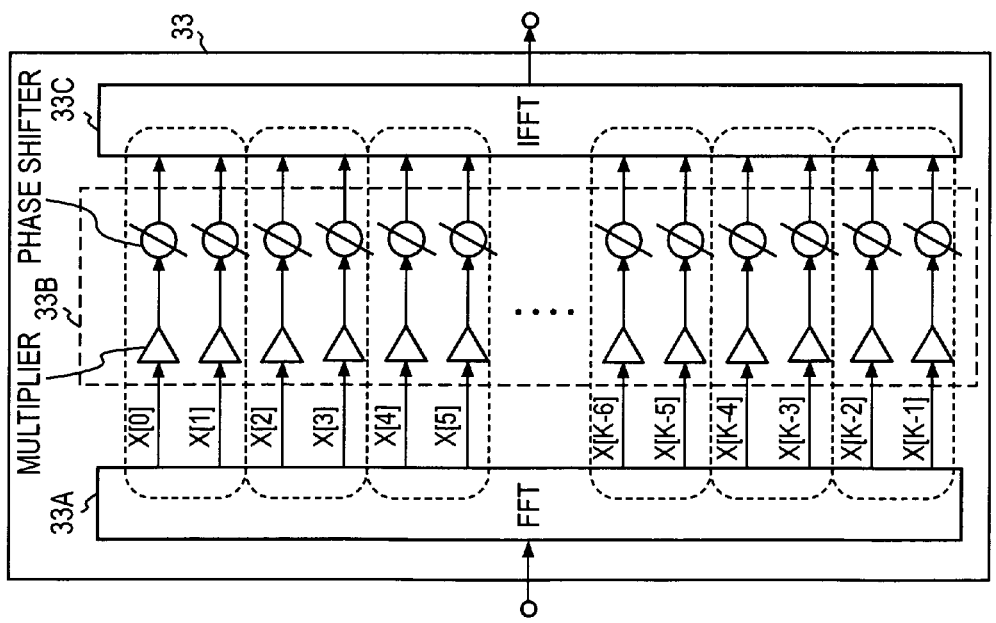
FIG. 10A shows an example of the frequency characteristic compensator that processes a plurality of spectrum samples concurrently.
Figure 11A:
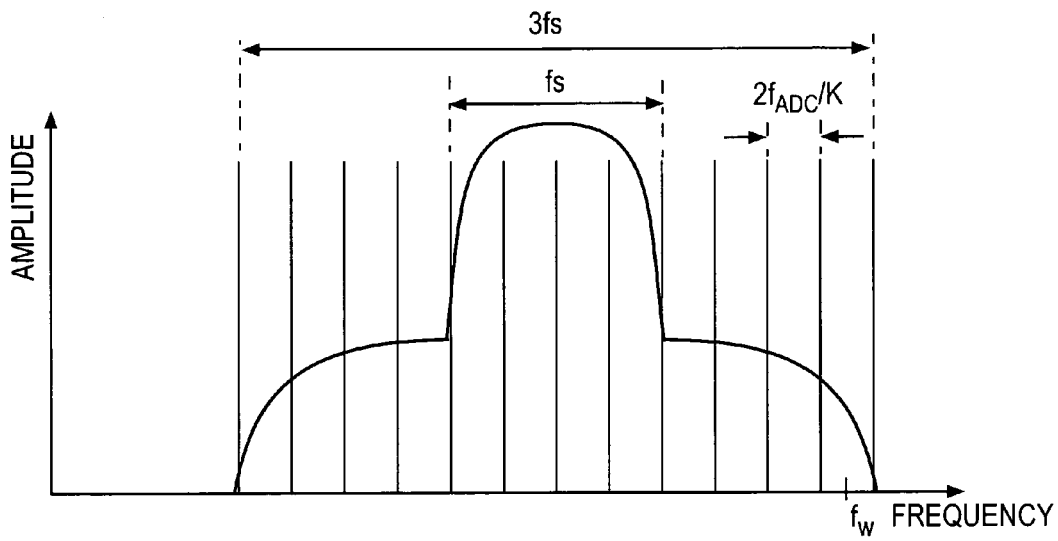
FIG. 11A is a schematic diagram for illustrating distortion compensation in the case shown in FIG. 10A.

In the example shown in FIG. 10A, K spectrum samples are divided into groups each containing two samples for adjustment. For example, spectrum samples X[0] and X[1] input to the frequency characteristic compensator 33 are grouped together and, thus, are adjusted by the coefficients adjuster 33B using the same adjustments. In this case, as can be seen from the spectrum amplitude characteristic shown in FIG. 11A, the amplitude adjustment is performed at regular intervals of 2 $f_{ADC}$/K over the entire frequency band width $f_{ADC}$=3 fs of the third-order distortion including the frequency band fs of the transmission signal x(t). Although not shown, the phase adjustment is performed in the same manner.

Figure 11B:
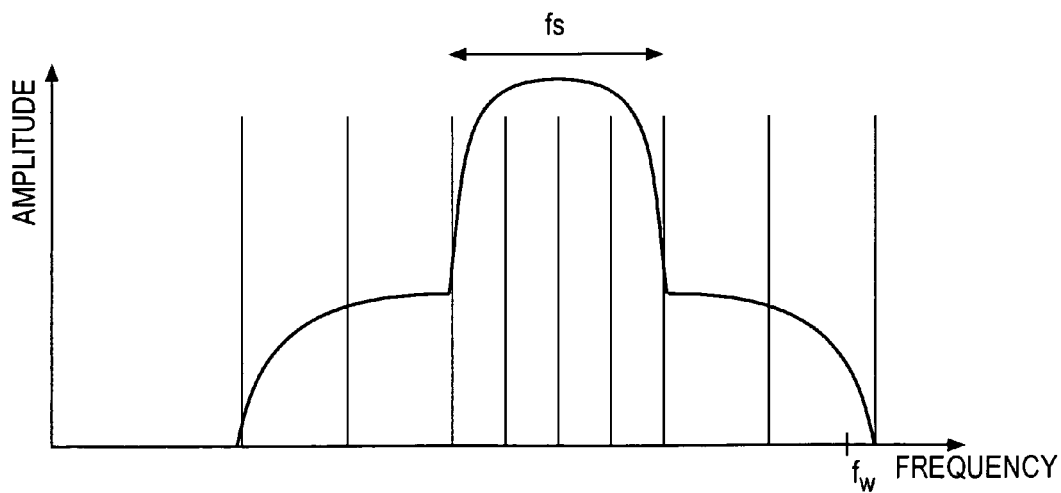
FIG. 11B is a schematic diagram for illustrating distortion compensation in the case shown in FIG. 10B.

In the example shown in FIG. 10B, outside the band of the transmission signal, the number of spectrum samples in each group is four, and within the frequency band fs of the transmission signal, the number of spectrum samples in each group is two. That is, in this case, as can be seen from the amplitude characteristic shown in FIG. 11B, the amplitude adjustment is performed at wider frequency intervals (4 $f_{ADC}$/K) outside the frequency band fs of the transmission signal and is performed at narrower frequency intervals (2 $f_{ADC}$/K) within the frequency band of the transmission signal. Thus, while the distortion compensation is intensively performed within the frequency band of the transmission signal, the distortion compensation can be less precisely performed outside the frequency band of the transmission signal, thereby reducing the processing time.

In order to perform the same adjustment on all the spectrum samples in each spectrum sample group in the frequency characteristic compensator 33, a series of windows each having a band width of $\Delta f$ for the distortion component are grouped in the distortion component frequency characteristic splitter 11 in the same manner as the grouping of the spectrum samples. Among the power values of the distortion components determined for all the windows in each group, one representative value DR is chosen and supplied to the frequency characteristic controller 12, and all the samples in the relevant spectrum sample group in the frequency characteristic compensator 33 are adjusted in the same manner in such a manner that the representative value $D_R$ becomes equal to or less than a target value. The representative value $D_R$ for each group may be an average power value of the distortion components detected by the windows in the group or the maximum value thereof, for example. In some cases, it may be the minimum value thereof. For example, the representative value $D_R$ is determined by a representative value determination unit 11C provided in the distortion component frequency characteristic splitter 11 as shown in FIG. 2.

Figure 12:
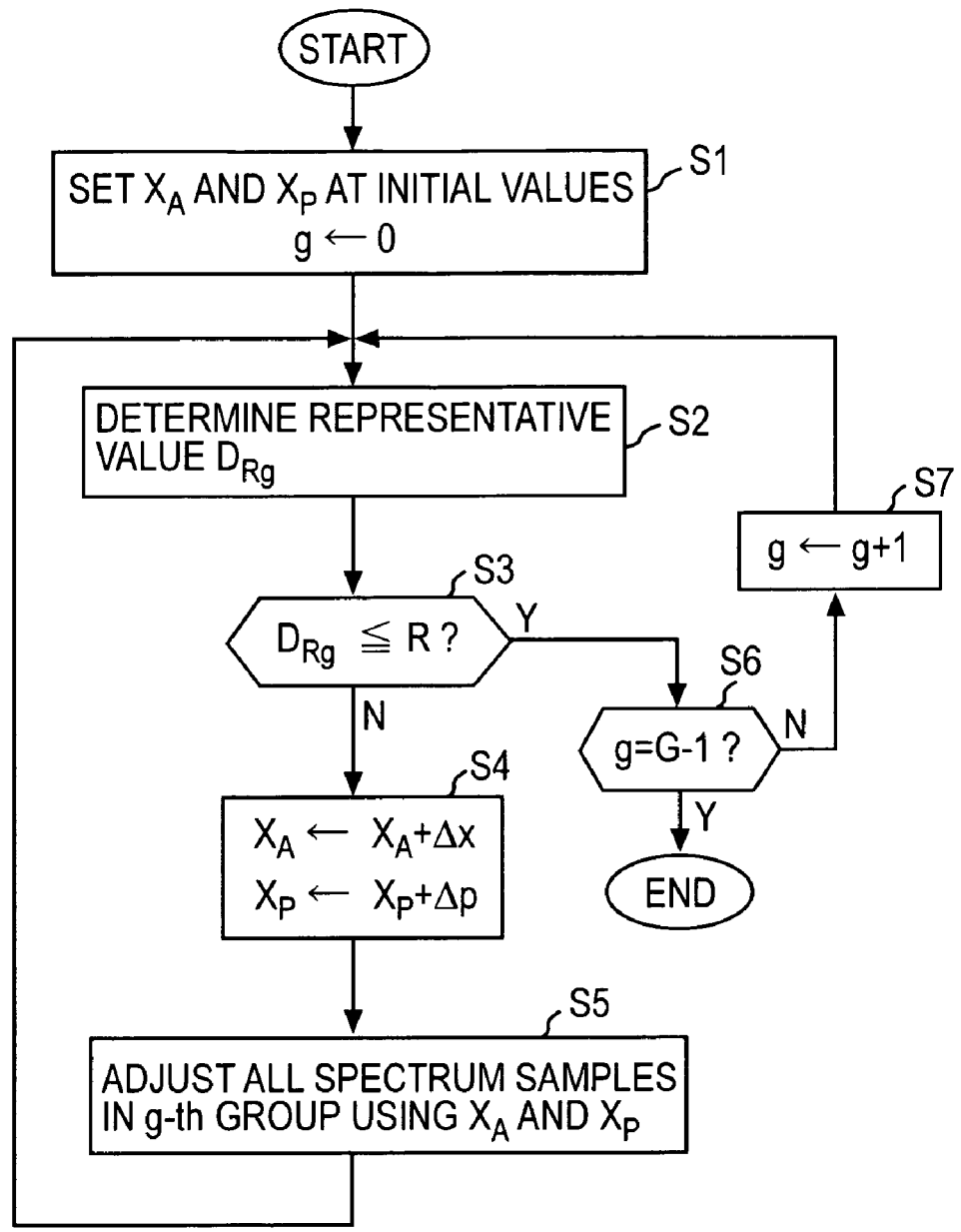
FIG. 12 is a flowchart showing a procedure of distortion compensation.

FIG. 12 is a flow chart illustrating a process of adjustment for adjusting the coefficients adjuster 33B of the frequency characteristic compensator 33 according to the third embodiment. Here, the number of groups is represented by "G", and the representative value for a g-th group (g=0, 1 . . . G−1) is represented by "$D_{Rg}$".

Step S1: Set initial values of adjustments $X_A$ and $X_P$ for the coefficients adjuster 33B in the frequency characteristic compensator 33, and set the initial value of g at 0.

Step S2: The representative value determination unit 11C determines the representative value $D_{Rg}$ from the power values of the detected distortion components for the windows in a g-th group.

Step S3: The frequency characteristic controller 12 determines whether the representative value $D_{Rg}$ is equal to or less than a target value R, and if it is equal to or less than the target value R, the process proceeds to step S6, or otherwise, the process proceeds to step S4.

Step S4: The frequency characteristic controller 12 increments the amplitude adjustment $X_A$ and the phase adjustment $X_P$ by $\Delta x$ and $\Delta p$, respectively.

Step S5: In the frequency characteristic compensator 33, all the spectrum samples in the g-th group are adjusted with the updated adjustments $X_A$ and $X_P$ by the associated multiplier and phase shifter in the coefficients adjuster 33B. This step adjusts each spectrum sample in the g-th group as expressed by the formulas (2) and (3).

Step S6: If the representative value $D_{Rg}$ is equal to or less than the target value R at step S3, it is determined whether g is equal to G−1, that is, whether the g-th group is the last one, and if g is equal to G−1, the process is ended. Otherwise, the process proceeds to step S7.

Step S7: g is incremented by 1, the process returns to step S2, and the same process is repeatedly performed on the next group.

In the case where each group in the frequency characteristic compensator 33 contains one spectrum sample, and each group in the distortion component frequency characteristic splitter 11 contains one window, the procedure shown in FIG. 12 is the same as the procedure according to the first embodiment. In this case, each representative value $D_{Rg}$ is the power value of the distortion components detected for the relevant window.

In the third embodiment shown in FIGS. 10A and 10B, the frequency interval of spectrum sampling by the FFT 33A in the frequency characteristic compensator 33 is selected equal to the band width $\Delta f$ of each split window in the distortion component frequency characteristic splitter 11. However, the distortion component frequency characteristic splitter 11 may split the frequency characteristic into expanded windows each having a band width equal to a band width of each group (which is a sum of the band widths of the windows in each group). In this case, the power of the distortion component detected for the expanded window is used as the representative value.

In the above description, the representative value determination unit 11C is provided in the distortion component frequency characteristic splitter 11. However, for example, the representative value determination unit 11C may be provided in the frequency characteristic controller 12.

Fourth Embodiment

Figure 13:
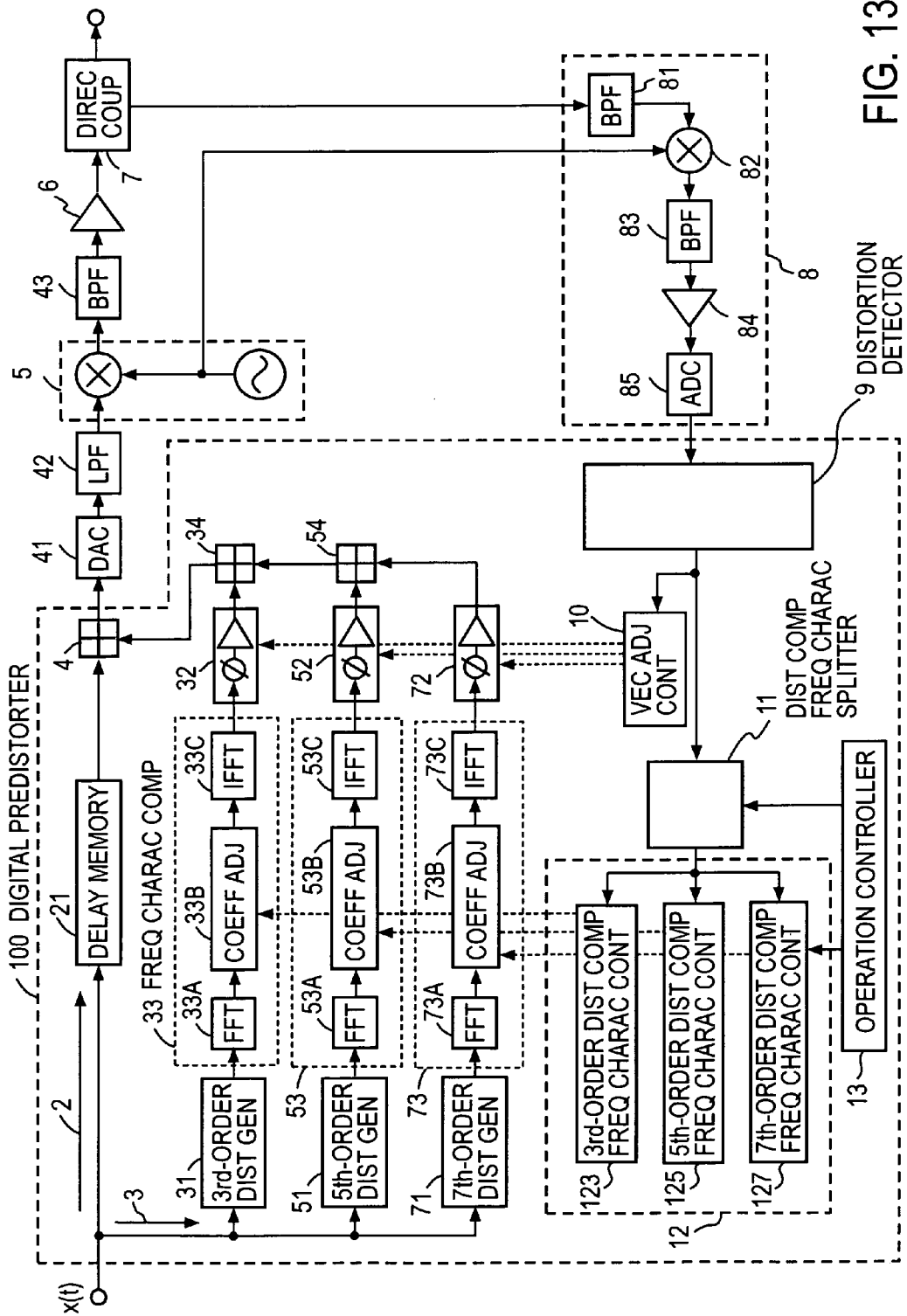
FIG. 13 shows an embodiment of a power series predistorter in which the number of odd order distortions is increased.

FIG. 13 shows an embodiment in which the number of orders of odd-order distortion components is increased, and an operation of a predistorter according to this embodiment will be described. While among those distortion components, which occur due to the nonlinearity of a power amplifier element 6, the third-order distortion component is dominant, distortions of higher orders, such as a fifth-order distortion component and a seventh-order distortion component, also occur. The embodiment shown in FIG. 13 is designed also to cope with the fifth-order and seventh-order distortion components. In this embodiment, it is supposed that a predistorter 100 involves digital processings.

A digital transmission signal x(t) of base band is input to the digital predistorter 100. The linear transmission path 2 of the digital predistorter 100 is constituted by a delay memory 21, such as a shift register. The delay memory 21 delays the digital transmission signal and supplies the delayed signal to the combiner (i.e., adder) 4. The distortion generation path 3 comprises three odd-order distortion generators including a third-order distortion generator 31, a fifth-order distortion generator 51 and a seventh-order distortion generator 71. Frequency characteristic compensators 33, 53 and 73 are connected to the outputs of the distortion generators 31, 51 and 71, respectively. For example, the frequency characteristic compensator 33 is composed of an FFT 33A, a coefficients adjuster 33B and an IFFT 33C connected in series to one another, as with the frequency characteristic compensator shown in FIG. 6. Similarly, the frequency characteristic compensator 53 is composed of an FFT 53A, a coefficients adjuster 53B and an IFFT 53C connected in series to one another, and the frequency characteristic compensator 73 is composed of an FFT 73A, a coefficients adjuster 73B and an IFFT 73C connected in series to one another.

The outputs of the frequency characteristic compensators 33, 53 and 73 are connected to vector adjusters 32, 52 and 72, respectively, each of which is composed of a phase shifter and a multiplier. The outputs of the vector adjusters 32, 52 and 72 are summed at adders 34 and 54, and the total sum is added to the digital transmission signal at the combiner (adder) 4.

The output of the combiner (adder) 4 is supplied to a digital-to-analog converter (abbreviated as DAC, hereinafter) 41 as the output of the digital predistorter 100 and converted into an analog signal. The resulting analog signal is supplied to a frequency converter 5 via a low-pass filter (abbreviated as LPF, hereinafter) for removing aliasing and converted into a input signal of the power amplifier.

A BPF 43 for removing out-of-band components produced due to the frequency conversion is connected to the output of the frequency converter 5. The output of the BPF 43 is input to the power amplifier 6. A directional coupler serving as a divider 7 is connected to the output of the power amplifier 6 to feed a part of the output of the power amplifier 6 back to the digital predistorter 100 for adjustment of predistortion component via a frequency converter 8.

The frequency converter 8, which is provided in the feedback path from the directional coupler 7, is composed of a BPF 81, a down converter 82 that converts the output signal of the power amplifier into a down-converted signal of base band, a BPF 83 that removes signals excluding the down-converted signal, an amplifier 84 that amplifies the down-converted signal, and an ADC 85 that converts the analog signal of base band output from the amplifier 84 into a digital signal of base band. The amplifier 84 may be omitted depending on the adjustment of the degree of coupling of the directional coupler 7.

The digital signal of base band recovered by the ADC 85 is passed to a distortion detector 9, which detects distortion components including a third-order distortion, a fifth-order distortion and a seventh-order distortion in the digital signal of base band. The digital signal of base band is then input to the distortion component frequency characteristic splitter 11, in which the entire band of the distortion component is split into windows as in the embodiments described above, and a power of distortion component is detected for each window. Distortion component frequency characteristic controllers 123, 125 and 127 constituting the frequency characteristic controller 12 adjust the coefficients adjusters 33B, 53B and 73B in the frequency characteristic compensators 33, 53 and 73 of the corresponding orders in the same manner as in the embodiments described above. On the other hand, the vector adjustment controller 10 controls the adjustments of phase and amplitude by the vector adjusters 32, 52 and 72. Furthermore, the distortion component frequency characteristic splitter 11 and the distortion component frequency characteristic controllers 123, 125 and 127 are controlled by the operation controller 13.

In the configuration described above, since the frequency characteristic of the distortion component of each of the odd-order distortion generators 31, 51 and 71 is compensated for with a single frequency characteristic, the distortion compensation can be adequately achieved without any discontinuity occurring in the distortion compensation characteristic.

Figure 14:
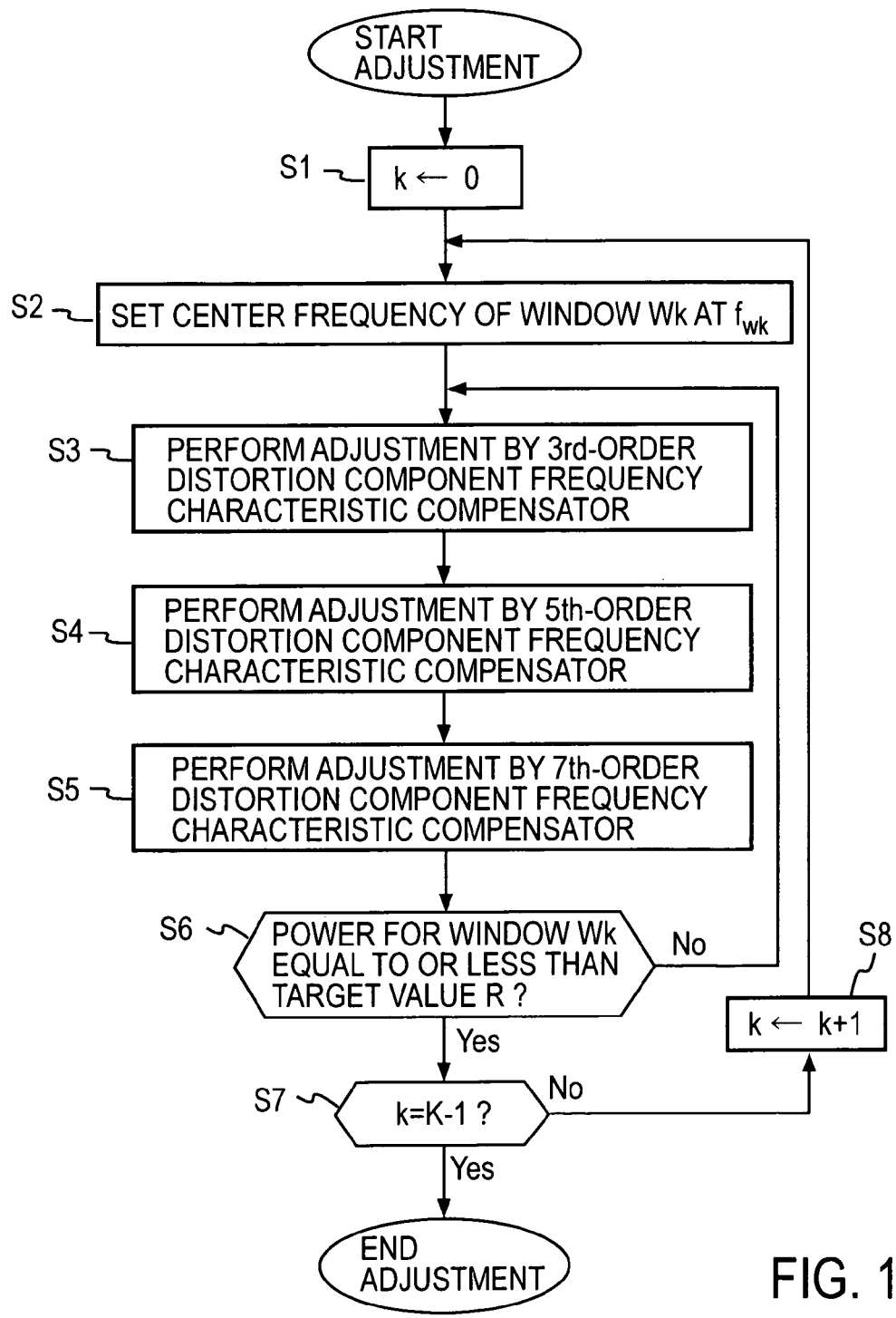
FIG. 14 is a flowchart showing an example of the control process by a operation controller 13 shown in FIG. 13.

FIG. 14 is a flowchart showing a control process in which the operation controller 13 controls the distortion component frequency characteristic splitter 11 and the distortion component frequency characteristic controllers 123, 125 and 127, and the operation will be now described. It is supposed that the range of variation of the center frequency $f_{wk}$ of the window is the band width 7 fs of the seventh distortion component, which is the maximum band width, the window width $\Delta f$ is 7 fs/K, and k=0, 1, ..., K−1. The center frequency $f_{wk}$ is successively shifted by $\Delta f$ to cover the entire band width 7 fs. In this embodiment, since the seventh-order and lower-order distortion components are to be compensated for, in the case where the communication scheme is the WCDMA as described above, the seventh-order distortion component produced for the signal having a band width of fs≈4.68 MHz has a frequency band width of 7 fs≈32.76 MHz. The center frequency $f_{wk}$ is to be set within this range.

The adjustments of the third-order distortion, the fifth-order distortion and the seventh-order distortion components by the coefficients adjuster 33B, 53B and 73B in the frequency characteristic compensators 33, 53 and 73 in steps S3, S4 and S5 in the distortion compensation process described below are carried out only when an window Wk lies within the frequency band widths 3 fs, 5 fs and 7 fs, respectively. For example, if the center frequency $f_{wk}$ of the window Wk lies in the frequency band 7 fs but out of the frequency band 5 fs, steps S3 and S4 are not carried out, and only step S5 is carried out. If the center frequency $f_{wk}$ lies in the frequency band 3 fs, all steps S3, S4 and S5 are carried out.

Once the adjustment is started, an initial value k=0 is set in step S1, and the center frequency of the window Wk in the distortion component frequency characteristic splitter 11 is set at $f_{wk}$ in step S2.

Then, in step S3, based on the result of distortion component detection for the window Wk by the distortion component frequency characteristic splitter 11, the third-order distortion component frequency characteristic controller 123 adjusts the coefficients adjuster 33B of the frequency characteristic compensator 33 for the third-order distortion component. This adjustment is repeated by changing the third-order distortion component adjustments $X^3_A$ and $X^3_P$ by $\Delta x$ and $\Delta p$, respectively, until the power of the distortion component detected for the current window Wk is reduced to a minimum. Similarly, based on the result of distortion component detection for the same window Wk, the fifth-order distortion component frequency characteristic controller 125 adjusts the coefficients adjuster 53B of the frequency characteristic compensator 53 in step S4, and the seventh-order distortion component frequency characteristic controller 127 adjusts the coefficients adjuster 73B of the frequency characteristic compensator 73 in step S5.

In step S6, it is determined whether the value of the power in the window Wk detected by the distortion component frequency characteristic splitter 11 is equal to or less than a target value R. If the power is not equal to or less than the target value R, the distortion adjustments of the distortion components in steps S3, S4 and S5 are repeated. If the power value is equal to or less than the target value R, in step S7, it is determined whether k=K−1, that is, whether the adjustment is completed for the entire frequency band. If the adjustment is not completed, the value k is incremented by one in step S8, the process returns to step S2, and steps S3 to S7 are repeated.

The target value R used in the control process described above may be a minimum value of the values detected by the distortion detector 9 or less or a certain threshold. Furthermore, the target value may be changed during the control process. For example, a certain target value is used in the first control of the third-order distortion generation path, and the third-order frequency characteristic compensator is controlled until the target value is reached. Then, when the third-order distortion generation path is controlled again after control of the fifth-order and seventh-order frequency characteristic compensators is finished, the target value can be changed to a smaller value. The same applies to the other orders. Specific distortion component compensation is the same as described above and will not be described here.

Modified Embodiment

Figure 15:
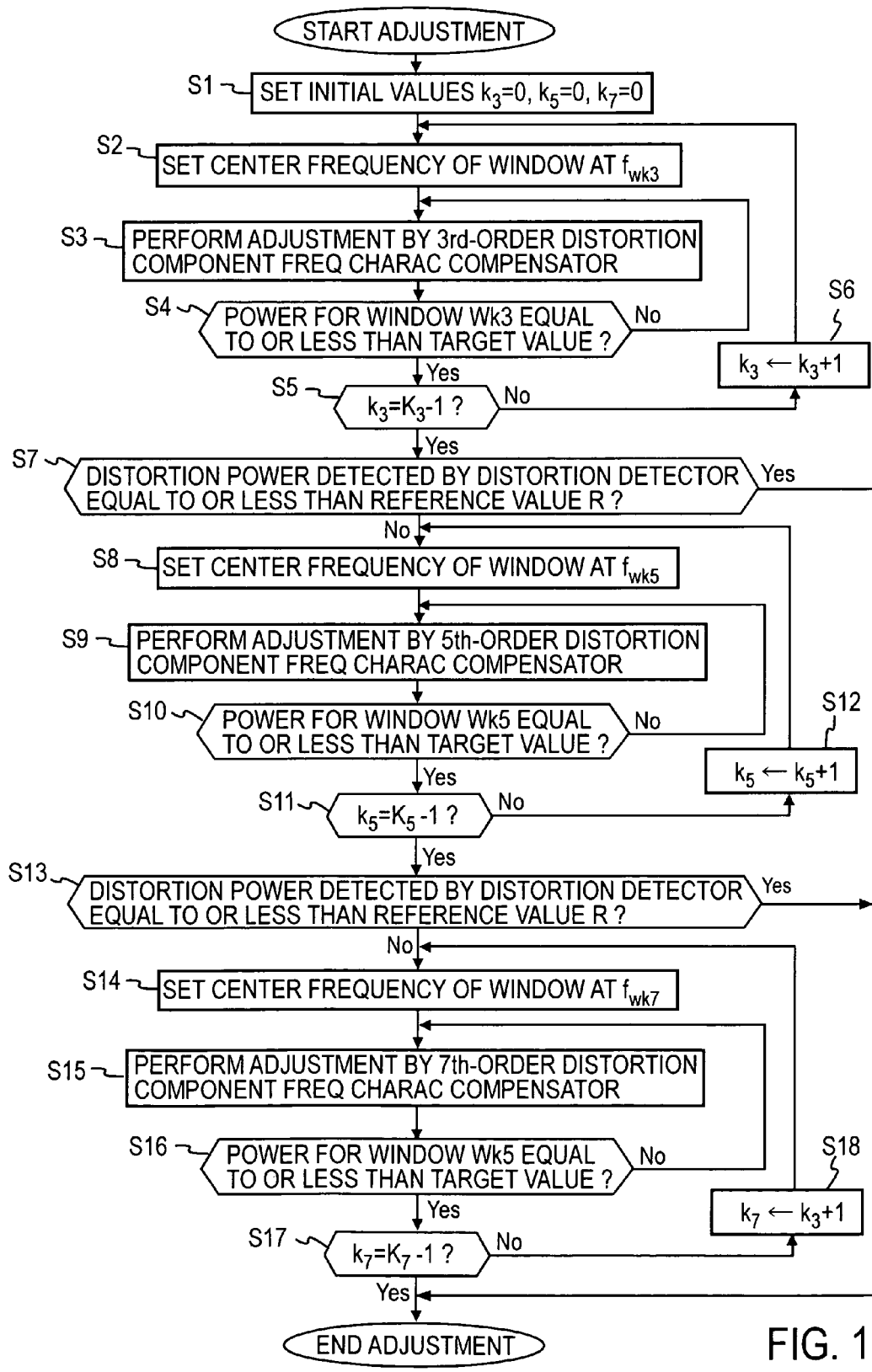
FIG. 15 is a flowchart showing another example of the control process by a operation controller 13 shown in FIG. 13.

FIG. 15 is a flowchart showing an operation of the operation controller 13 in which compensation for an odd-order distortion component by sweeping (shifting) the center frequency of the window over the frequency band of the distortion component is repeated while increasing the order successively. This operation is intended to improve the practical utility of the present invention by separating the compensation operation for the dominant third-order distortion component from the compensation operation for the higher-odd-order distortion components. This modified embodiment is novel in that it is determined whether to carry out the compensation for the next-higher-order distortion component after compensation of the lowest-order distortion is finished.

In the distortion compensation process described below, the frequency bands 3 fs, 5 fs and 7 fs of the third-order, fifth-order and seventh-order distortion components are split into $K_3$, $K_5$ and $K_7$ windows $Wk_3$ ($k_3$=0, 1, ..., $K_3$−1), $Wk_5$ ($k_5$=0, 1, ..., $K_5$−1) and $Wk_7$ ($k_7$=0, 1, ..., $K_7$−1) having the same band width of $\Delta f$, respectively.

Once the adjustment is started, initial values $k_3$=0, $k_5$=0, and $k_7$=0 are set in step S1. In step S2, the center frequency $f_{wk3}$ of the detection window $Wk_3$ in the distortion component frequency characteristic splitter 11 is set. In this regard, the third-order distortion component to be compensated for has a frequency band width 3 fs≈14.04 MHz, and the window having a band width of $\Delta f$ is set within the frequency range. In step S3, based on the power of the distortion component detected for the window $Wk_3$, the third-order distortion component frequency characteristic controller 123 adjusts the coefficients adjuster 33B in the frequency characteristic compensator 33 for the third-order distortion component. In step S4, it is determined whether the power of the distortion component detected for the window $Wk_3$ after the adjustment is equal to or less than a target value. If the power is not equal to or less than the target value, the process returns to step S3, and the distortion adjustment is repeated. If the power of the distortion component is equal to or less than the target value, it is determined, in step S5, whether $k_3$=$K_3$−1, that is, whether the adjustment of the coefficients adjuster 33B for the third-order distortion component in the frequency characteristic compensator 33 is completed for all the $K_3$ windows.

If the adjustment is not completed for all the $K_3$ windows, the value $k_3$ is incremented by one in step S6, and the process returns to step S2. If it is determined that $k_3$=$K_3$−1 in step S5, it is determined, in step S7, whether the power of the whole distortion components detected by the distortion detector 9 is equal to or less than a reference value R. If the power is equal to or less than the reference value R, that is, if the power of the distortion components in the output of the power amplifier 6 is equal to or less than the reference value R, further distortion compensation is not required, so that the distortion compensation process is ended without carrying out the compensation for the fifth-order and seventh-order distortion components.

In step S7, if it is determined that the power of the distortion components detected by the distortion detector 9 is not equal to or less than the reference value R, the coefficients adjuster 53B in the frequency characteristic compensator 53 compensates for the fifth-order distortion component through steps S8 to S12 as with steps S2 to S6 for the third-order distortion component described above. The fifth-order distortion component to be compensated for has a frequency band width 5 fs≈23.4 MHz, and the coefficients adjuster 53B in the frequency characteristic compensator 53 adjusts the fifth-order distortion component while successively shifting the window having a band width of $\Delta f$ within the frequency range. Then, as with the determination in step S7, in step S13, it is determined whether the power of the distortion component detected by the distortion detector 9 is equal to or less than a reference value R. If the power is equal to or less than the reference value R, the distortion compensation process is ended without carrying out the compensation for the next seventh-order distortion component. If the power is not equal to or less than the reference value R, the seventh-order distortion component is compensated for through steps S14 to S18 in the same manner as the compensation for the third-order distortion component described above. The seventh-order distortion component has a frequency band width 7 fs≈32.76 MHz and the window having a band width of $\Delta f$ is shifted within the frequency range.

In the process shown in FIG. 15, either or both of steps S7 and S13 may be omitted. In addition, while the frequency characteristics of the third-order distortion component, the fifth-order distortion component and the seventh-order distortion component are split into equal band widths, that is, windows of an equal band width $\Delta f$ in the above description, it is also possible to set that $K_3$=$K_5$=$K_7$=K to provide windows with different band widths $\Delta f$ of 3 fs/K, 5 fs/K and 7 fs/K for the third-order, fifth-order and seventh-order distortion components, respectively. In the example shown in FIG. 15, higher-order distortion components up to the seventh-order are compensated for. However, a ninth-order or higher-order distortion components may be compensated for. In such a case, when compensation for the distortion of each order is completed, it can be determined whether to end the distortion compensation process as described above. The determination of whether to carry out compensation for a higher-order distortion component is made in the frequency characteristic controller 12 (see FIG. 2), for example. Furthermore, if it is desirable to enhance the effect of distortion compensation, the third-order distortion component can be compensated for again after compensation for the higher-order distortion components is finished. This can advantageously reduce the time required for the distortion compensation.

In the case where the communication scheme is the WCDMA, the third-order distortion component has a frequency band of 14.04 MHz, the fifth-order distortion component has a wider frequency band of 23.4 MHz, and the seventh-order distortion component has a still wider frequency band of 32.76 MHz. In general, the power of the third-order distortion component is the largest. Thus, for example, in order to quickly suppress distortion component to render the radio equipment into operable state when the radio equipment is powered on, only the compensation for the lowest-order distortion component, that is, the third-order distortion component may be sufficient.

Thus, by determining whether to carry out compensation for the next-higher-order distortion component when compensation for the distortion component of each order is finished, the actual time for distortion compensation can be advantageously reduced.

As described above, the frequency band in which the distortion component increases as the order of the distortion component becomes higher. However, there is no need of carrying out the distortion compensation over the entire frequency band. The frequency band over which the distortion compensation is carried out can be narrowed depending on the power amplifier.

In the method described above with reference to FIG. 15, the third-order distortion component is first compensated for, and then the higher-order distortion components are successively compensated for. However, the present invention is not limited to this order. For example, only the fifth-order or seventh-order distortion component may be compensated for before the distortion compensation process is ended.

Fifth Embodiment

Figure 16:
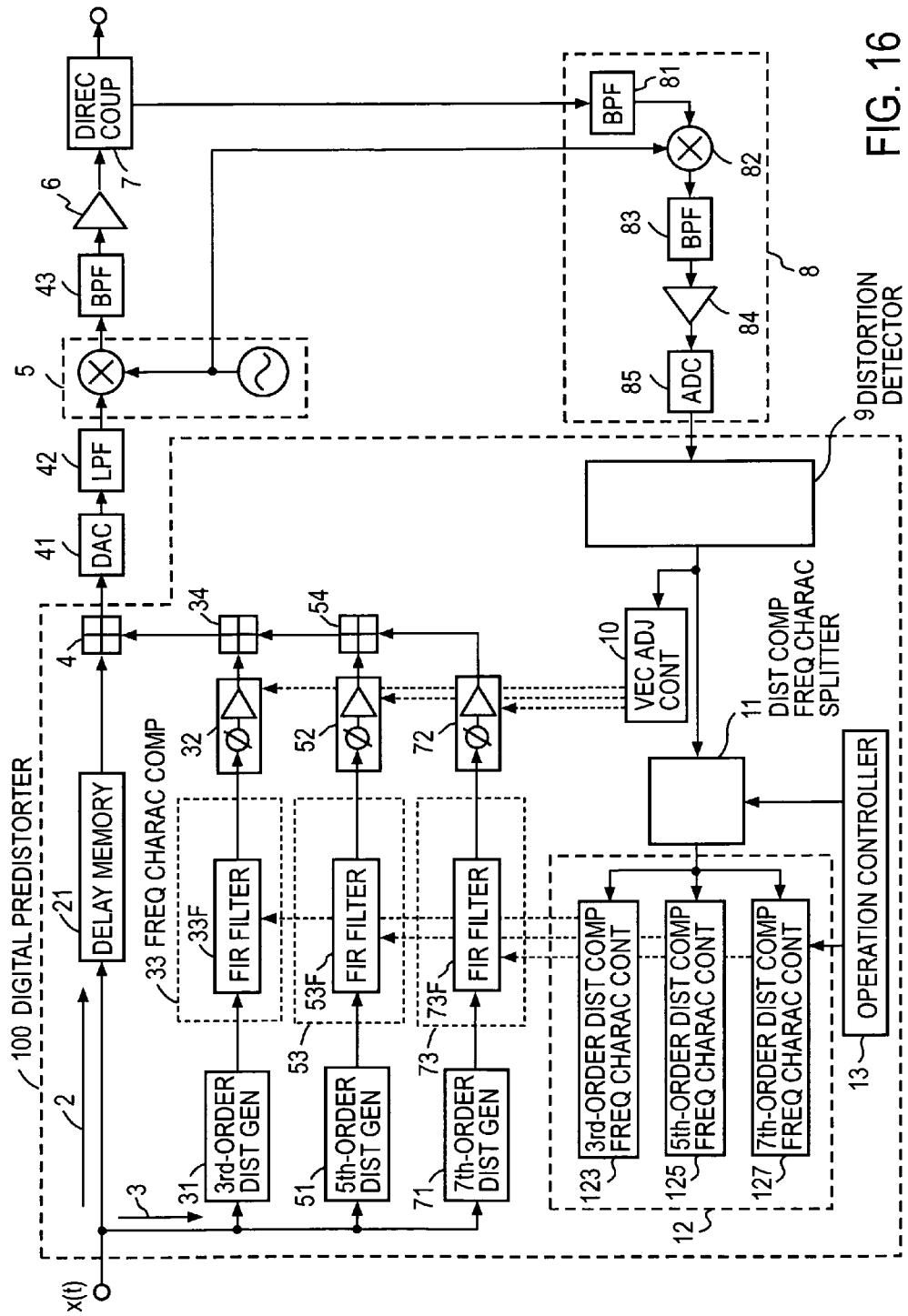
FIG. 16 is a diagram showing an example of the predistorter in which the frequency characteristic compensator is constituted by an FIR filter.

FIG. 16 shows an embodiment in which the third-order, fifth-order and seventh-order distortion component frequency characteristic compensators 33, 53 and 73 in the third embodiment (shown in FIG. 13) are constituted by FIR filters 33F, 53F and 73F, respectively. The rest of the configuration is identical to that shown in FIG. 13.

Figure 17:
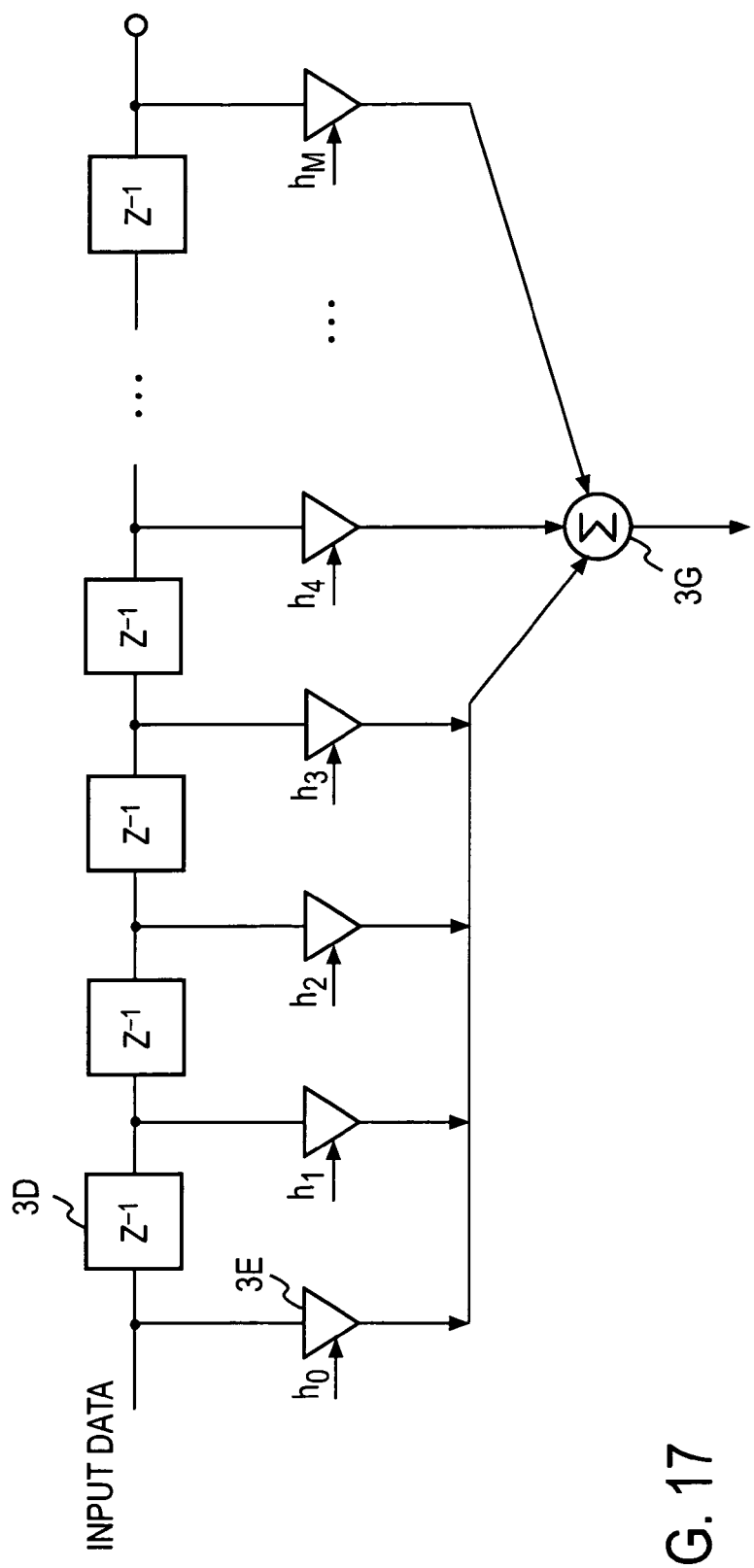
FIG. 17 is a diagram showing a configuration of the FIR filter.

The FIR filter constituting each of the frequency characteristic compensators 33, 53 and 73 is composed, as shown in FIG. 17 for example, of M stages of cascaded delay elements 3D, multipliers 3E that multiply the signals at the input/output terminals of the delay elements 3D by their respective preset tap coefficients $h_0$ to $h_M$, and an adder 3G that sums all the outputs of the multipliers 3E. The frequency characteristic of the FIR filter depends on the tap coefficients $h_0$ to $h_M$ and the number M of stages of the filter, which are determined in accordance with the transfer function of the filter.

The third-order distortion component frequency characteristic controller 123, the fifth-order distortion component frequency characteristic controller 125 and the seventh-order distortion component frequency characteristic controller 127 adjust the filter coefficients of the FIR filter 33F that controls the frequency characteristic of the third-order distortion component, the FIR filter 53F that controls the frequency characteristic of the fifth-order distortion component, and the FIR filter 73F that controls the frequency characteristic of the seventh-order distortion component, respectively, in such a manner that the power of the distortion component detected for each window having a band width of Δf by the distortion component frequency characteristic splitter 11 is reduced to a minimum. Thus, since the frequency characteristic of a single FIR filter, which serves as the frequency characteristic compensator, is controlled for each distortion component, highly precise distortion compensation can be achieved without any discontinuity occurring in the distortion compensation characteristic.

As described above, the power series predistorter according to the present invention controls the relevant frequency characteristic of the frequency characteristic compensator based on the distortion component detected for each window having a band width of Δf, and therefore, any discontinuity does not occur in the frequency characteristic of the distortion compensation.

What is claimed is:

1. A power series predistorter that generates a predistortion component for compensating for a distortion component produced by a power amplifier, comprising:

a linear transmission path for linearly transmitting an input transmission signal;

a distortion generation path including an odd-order distortion generator for generating an odd-order distortion component from the input transmission signal;

a frequency characteristic compensator inserted in series in the distortion generation path, for adjusting the frequency characteristic of the odd-order distortion component;

a combiner for combining an output of the linear transmission path and an output of the distortion generation path to form an output of the predistorter;

a distortion detector for detecting a distortion component in an output of the power amplifier resulted from the input transmission signal;

a distortion component frequency characteristic splitter for splitting the frequency characteristic of the detected distortion component in the output of the power amplifier into windows each having a predetermined band width, for detecting a power of the distortion component in each of the windows, and for grouping the windows into a plurality of groups, each group containing plural windows, a number of windows in each group inside of a frequency band of said input transmission signal differing from a number of windows in each group outside of the frequency band of said input transmission signal; and a frequency characteristic controller for controlling adjustment of coefficients in respective frequency bands of the frequency characteristic of said odd-order distortion component generated from the input transmission signal by the frequency characteristic compensator based on the powers of the distortion components detected in the corresponding windows;

wherein said distortion component frequency characteristic splitter comprises a first FFT processing unit that performs FFT on said detected distortion component to provide a predetermined number of spectrum samples as a plurality of the distortion components in said windows and a power detector for detecting a power of each spectrum sample received from said first FFT processing unit as the power of distortion component detected for each window, said frequency characteristic compensator comprises a second FFT processing unit that converts every predetermined number of samples input to said frequency characteristic compensator into a predetermined number of spectrum samples in the frequency domain, a plurality of coefficients adjusters each for changing amplitude and phase of the respective spectrum sample in the output of said second FFT processing unit based on the power of the distortion component detected in the window associated with said spectrum sample, and an IFFT processing unit that converts outputs of said plurality of coefficients adjusters into samples in the time domain, the predetermined number of spectrum samples being divided into a plurality of groups, each group containing plural spectrum samples in correspondence with a respective group of windows of the frequency characteristic of the detected distortion component, and the distortion component frequency characteristic splitter comprises a representative value determination unit that determines a representative value of the detected powers of every plurality of windows in each group, and wherein said frequency characteristic controller controls every plurality of said coefficients adjusters corresponding to said every plurality of windows to perform a common control on a plurality of spectrum samples associated with a respective group of said plurality of windows based on the representative value thereof.

2. The power series predistorter according to claim 1, wherein said odd-order distortion generator comprises a plurality of odd-order distortion generators that receive said input transmission signal and generate a plurality of distortion components of different odd orders, and said frequency characteristic compensator comprises a plurality of frequency characteristic compensators that adjust the outputs of said plurality of odd-order distortion generators respectively.

3. The power series predistorter according to claim 1, wherein said frequency characteristic compensator is constituted by an FIR filter, and the transfer function of said FIR filter is controlled by said frequency characteristic controller based on said windows.

4. The power series predistorter according to claim 1, further comprising:
a vector adjuster that is provided in said distortion generation path, for adjusting phase and amplitude of the odd-order distortion component generated by said odd-order distortion generator; and
a vector adjustment controller for controlling said vector adjuster based on the distortion component detected by said distortion detector.

5. A control method for a power series predistorter that compensates for a distortion component produced by a power amplifier, comprising steps of:
(a) distributing an input transmission signal to a linear transmission path and a distortion generation path;
(b) generating an odd-order distortion component from the input transmission signal in said distortion generation path;
(c) adjusting the frequency characteristic of the odd-order distortion component on a predetermined-band-width basis;
(d) combining said adjusted odd-order distortion component and the output of said linear transmission path and outputting the result of the combination from said power series predistorter;
(e) detecting a distortion component in the output of the power amplifier;

(f) performing FFT on said detected distortion component to obtain a plurality of frequency bands of windows each having a predetermined band width and detecting a power of the distortion component in each window, and grouping the windows into a plurality of groups, each group containing plural windows, a number of windows in each group inside of a frequency band of said input transmission signal differing from a number of windows in each group outside of the frequency band of said input transmission signal; and
(g) controlling adjustment of each frequency band in the frequency characteristic of the odd-order distortion component in said distortion generation path corresponding to said window based on the power of the distortion component detected in said window,
wherein said step (f) includes a step of determining a representative value of the powers of the distortion components detected in a plurality of windows, and said step (g) is a step of performing a common control on a plurality of spectrum samples associated with said plurality of windows based on said representative value.

6. The control method according to claim 5, wherein said step (b) is a step of generating a plurality of distortion components of different odd orders for the input transmission signal, said step (c) is a step of adjusting the frequency characteristic of each of said plurality of distortion components of different odd orders on a predetermined-band-width basis, said step (d) is a step of combining said plurality of adjusted distortion components of different odd orders and the output of said linear transmission path, and said step (g) is a step of controlling the band-based adjustment of the frequency characteristic of each of said plurality of distortion components of different odd orders based on the power of the distortion component detected in each window.

7. The control method according to claim 6, wherein said step (g) comprises a step of determining whether said power of the detected distortion component is equal to or less than a target value before the adjustment of each odd-order distortion and a step of omitting the adjustment of the next odd-order distortion if the power is equal to or less than the target value.

8. The control method according to claim 5, further comprising steps of:
(h) determining a power of said detected distortion component; and
(i) adjusting a vector of said odd-order distortion based on the power of said distortion component.

9. The power series predistorter according to claim 1, wherein the distortion component frequency characteristic splitter has an input connected to the output of said distortion detector.

* * * * *